US009190561B2

(12) United States Patent
Teranishi et al.

(10) Patent No.: US 9,190,561 B2
(45) Date of Patent: Nov. 17, 2015

(54) SEMICONDUCTOR LIGHT EMITTING ELEMENT AND LIGHT EMITTING DEVICE

(71) Applicants: Shunsuke Teranishi, Ichihara (JP); Hisao Sato, Ichihara (JP)

(72) Inventors: Shunsuke Teranishi, Ichihara (JP); Hisao Sato, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

(21) Appl. No.: 13/722,042

(22) Filed: Dec. 20, 2012

(65) Prior Publication Data

US 2013/0168637 A1    Jul. 4, 2013

(30) Foreign Application Priority Data

Dec. 28, 2011    (JP) .................................. 2011-288601

(51) Int. Cl.
| | |
|---|---|
| H01L 33/04 | (2010.01) |
| H01L 33/06 | (2010.01) |
| H01L 33/32 | (2010.01) |
| H01L 33/14 | (2010.01) |

(52) U.S. Cl.
CPC ................ *H01L 33/04* (2013.01); *H01L 33/06* (2013.01); *H01L 33/32* (2013.01); *H01L 33/145* (2013.01)

(58) Field of Classification Search
CPC ...................................................... H01L 33/04
See application file for complete search history.

(56) References Cited

U.S. PATENT DOCUMENTS

| | | | |
|---|---|---|---|
| 6,744,064 B2 | 6/2004 | Lee et al. | |
| 7,724,795 B2 | 5/2010 | Son et al. | |
| 7,923,716 B2 | 4/2011 | Lee et al. | |
| 8,466,449 B2 | 6/2013 | Lee et al. | |
| 2006/0260671 A1* | 11/2006 | Ohta et al. | .................... 136/249 |
| 2006/0273329 A1* | 12/2006 | Ohta et al. | ...................... 257/79 |

(Continued)

FOREIGN PATENT DOCUMENTS

| | | |
|---|---|---|
| JP | 2009-123717 A | 6/2009 |
| JP | 2011-222812 A | 11/2011 |

(Continued)

OTHER PUBLICATIONS

Rafid A. Abdullah, et al.; Effects of Quantum Confined Stark Effect and Well Thickness on Optical Properties of Double Quantum Wells Violet InGaN Laser Diodes; Optik—International Journal for Light and Electron Optics; vol. 124; Issue 4; Feb. 2013; pp. 292-296.

(Continued)

*Primary Examiner* — Seahvosh Nikmanesh
(74) *Attorney, Agent, or Firm* — Sughrue Mion, PLLC

(57) ABSTRACT

A semiconductor light emitting element includes an n-type semiconductor layer containing n-type impurities, a light emitting layer stacked on the n-type semiconductor layer, and a p-type semiconductor layer stacked on the light emitting layer and containing p-type impurities. The light emitting layer includes three or more well layers, and four or more barrier layers composed of a group-III nitride semiconductor having a larger band gap than that of the well layers, and each of the three or more well layers is sandwiched from both sides by neighboring two of the barrier layers. The three or more well layers include plural n-side well layers each having a first thickness to emit light of a common wavelength, and one or plural p-side well layers each having a second thickness larger than the first thickness and having a different composition from the n-side well layers to emit light of the common wavelength.

7 Claims, 10 Drawing Sheets

(56) References Cited

U.S. PATENT DOCUMENTS

| | | |
|---|---|---|
| 2010/0025684 A1* | 2/2010 | Shinohara et al. .............. 257/49 |
| 2011/0186815 A1 | 8/2011 | Lee et al. |
| 2011/0187294 A1 | 8/2011 | Bergmann et al. |
| 2011/0198633 A1 | 8/2011 | Tachibana et al. |
| 2011/0227033 A1* | 9/2011 | Kushibe et al. ................ 257/13 |
| 2011/0248238 A1 | 10/2011 | Yoon et al. |
| 2012/0241770 A1 | 9/2012 | Na et al. |
| 2013/0069033 A1 | 3/2013 | Kushibe et al. |
| 2013/0328011 A1* | 12/2013 | Teranishi et al. ............... 257/13 |
| 2014/0048767 A1 | 2/2014 | Kusunoki et al. |

FOREIGN PATENT DOCUMENTS

| | | |
|---|---|---|
| JP | 2011-223002 A | 11/2011 |
| JP | 2012-204839 A | 10/2012 |

OTHER PUBLICATIONS

You-da Lin, et al.; "High Quality InGaN/AlGaN Mutiple Quantum Wells for Semipolar InGaN Green Laser Diodes"; Applied Physics Express 3; (2010); 082001; pp. 082001-1 to 082001-3.

Communication dated Nov. 5, 2014 from the United States Patent Office in related U.S. Appl. No. 13/911,486 (published as US 2013/0328011).

Tsai, Chia-Lung et al., "Effects of an Asymmetric Barrier Layer on the Structural and Optical Properties of InGAN LEDs" Journal of the Electrochemical Society, 5 pages total, Feb. 14, 2012.

* cited by examiner

| FORWARD CURRENT DENSITY (A/cm²) | | 18.2 | 45.5 | 72.8 | 91.0 | 109.2 |
|---|---|---|---|---|---|---|
| NORMALIZED EMISSION OUTPUT | COMPARATIVE EXAMPLE 1 | 1.00 | 2.35 | 3.52 | 4.24 | 4.93 |
| | EXAMPLE 2 | 1.07 | 2.55 | 3.88 | 4.70 | 5.47 |

※ NORMARIZED BY VALUE OF 18.2A/cm² IN COMPARATIVE EXAMPLE 1

SEMICONDUCTOR LIGHT EMITTING ELEMENT AND LIGHT EMITTING DEVICE

CROSS REFERENCE TO RELATED APPLICATIONS

This application is based on and claims priority under 35 USC §119 from Japanese Patent Application No. 2011-288601 filed Dec. 28, 2011.

BACKGROUND

1. Technical Field

The present invention relates to a semiconductor light emitting element using group-III nitride semiconductors and a light emitting device provided with a semiconductor light emitting element.

2. Related Art

Generally, a semiconductor light emitting element using group-III nitride semiconductors includes a light emitting layer composed of a group-III nitride semiconductor between an n-type group-III nitride semiconductor layer and a p-type group-III nitride semiconductor layer. The n-type group-III nitride semiconductor layer contains n-type impurities for generating electrons as carriers, and the p-type group-III nitride semiconductor layer contains p-type impurities for generating holes as carriers. In this type of semiconductor light emitting elements, it is known that the light emitting layer has a multiquantum well structure including plural well layers and barrier layers alternately stacked (refer to Japanese Patent Application Laid-Open Publication No. 2011-222812).

Even such a semiconductor light emitting element that uses group-III nitride semiconductors and includes a light emitting layer having a multiquantum well structure suffers from reduction in the light emission efficiency in some cases when many holes or electrons are not recombined with each other in the multiple well layers of the light emitting layer. The light emission efficiency is considerably reduced especially under the conditions of a high current density.

An object of the present invention is to increase the light emission efficiency of a semiconductor light emitting element and maintain the increased efficiency also in a high current range while keeping the unity of wavelength of light outputted from the semiconductor light emitting element.

SUMMARY

According to the present invention, there is provided a semiconductor light emitting element, including: an n-type semiconductor layer that is composed of a group-III nitride semiconductor containing n-type impurities; a light emitting layer that is stacked on the n-type semiconductor layer, is composed of a group-III nitride semiconductor, and emits light when being supplied with current; and a p-type semiconductor layer that is stacked on the light emitting layer and is composed of a group-III nitride semiconductor containing p-type impurities. The light emitting layer includes: three or more well layers that are composed of a group-III nitride semiconductor; and four or more barrier layers that are composed of a group-III nitride semiconductor having a larger band gap than that of the well layers, and are provided such that each of the three or more well layers is sandwiched from both sides by neighboring two of the barrier layers, and that one of the barrier layers at a boundary with the n-type semiconductor layer is connected to the n-type semiconductor while another one of the barrier layers at a boundary with the p-type semiconductor layer is connected to the p-type semiconductor layer, and the three or more well layers include: plural n-side well layers that are provided in order from a side closer to the n-type semiconductor layer, and each of which has a first thickness to emit light of a common wavelength; and one or plural p-side well layers that are provided between a side closer to the p-type semiconductor layer and the n-side well layers, and each of which has a second thickness larger than the first thickness and has a different composition from the n-side well layers to emit light of the common wavelength.

Further, the one or plural p-side well layers include only one of the well layers that is the closest to the p-type semiconductor layer, and the plural n-side well layers may include all the well layers except the p-side well layer.

Furthermore, in the four or more barrier layers, all the barrier layers except the barrier layer located between the one or plural p-side well layers and the plural n-side well layers have a third thickness, and the barrier layer located between the one or plural p-side well layers and the plural n-side well layers has a fourth thickness smaller than the third thickness.

Still furthermore, the four or more barrier layers are composed of GaN, and the three or more well layers are composed of GaInN, and a concentration of In in the one or plural p-side well layers of the well layers is lower than a concentration of In in the plural n-side well layers of the well layers.

From another aspect of the present invention, there is provided a light emitting device, including: a base in which a first wire and a second wire are formed; and a semiconductor light emitting element that is attached to the base, is electrically connected to the first wire and the second wire, and emits light when being supplied with current through the first wire and the second wire. The semiconductor light emitting element includes: an n-type semiconductor layer that is composed of a group-III nitride semiconductor containing n-type impurities; a light emitting layer that is stacked on the n-type semiconductor layer, is composed of a group-III nitride semiconductor, and emits light when being supplied with current; a p-type semiconductor layer that is stacked on the light emitting layer and is composed of a group-III nitride semiconductor containing p-type impurities; a p-side electrode that electrically connects the p-type semiconductor layer and the first wire; and an n-side electrode that electrically connects the n-type semiconductor layer and the second wire. The light emitting layer includes: three or more well layers that are composed of a group-III nitride semiconductor; and four or more barrier layers that are composed of a group-III nitride semiconductor having a larger band gap than that of the well layers, and are provided such that each of the three or more well layers is sandwiched from both sides by neighboring two of the barrier layers, and that one of the barrier layers at a boundary with the n-type semiconductor layer is connected to the n-type semiconductor while another one of the barrier layers at a boundary with the p-type semiconductor layer is connected to the p-type semiconductor layer, the three or more well layers include: plural n-side well layers that are provided in order from a side closer to the n-type semiconductor layer, and each of which has a first thickness to emit light of a common wavelength; and one or plural p-side well layers that are provided between a side closer to the p-type semiconductor layer and the n-side well layers, and each of which has a second thickness larger than the first thickness and have a different composition from the plural n-side well layers to emit light of the common wavelength.

According to the present invention, it is possible to increase the light emission efficiency of a semiconductor light emitting element and maintain the increased efficiency also in a high current range while keeping the unity of wavelength of light outputted from the semiconductor light emitting element.

BRIEF DESCRIPTION OF THE DRAWINGS

An exemplary embodiment of the present invention will be described in detail based on the following figures, wherein.

DETAILED DESCRIPTION

Hereinafter, a description is given of an exemplary embodiment of the present invention in detail with reference to the accompanying drawings. In the following description, the size, thickness, and the like of each part in the referred drawings are different from the dimensions of an actual semiconductor light emitting element in some cases.

Figure 1:
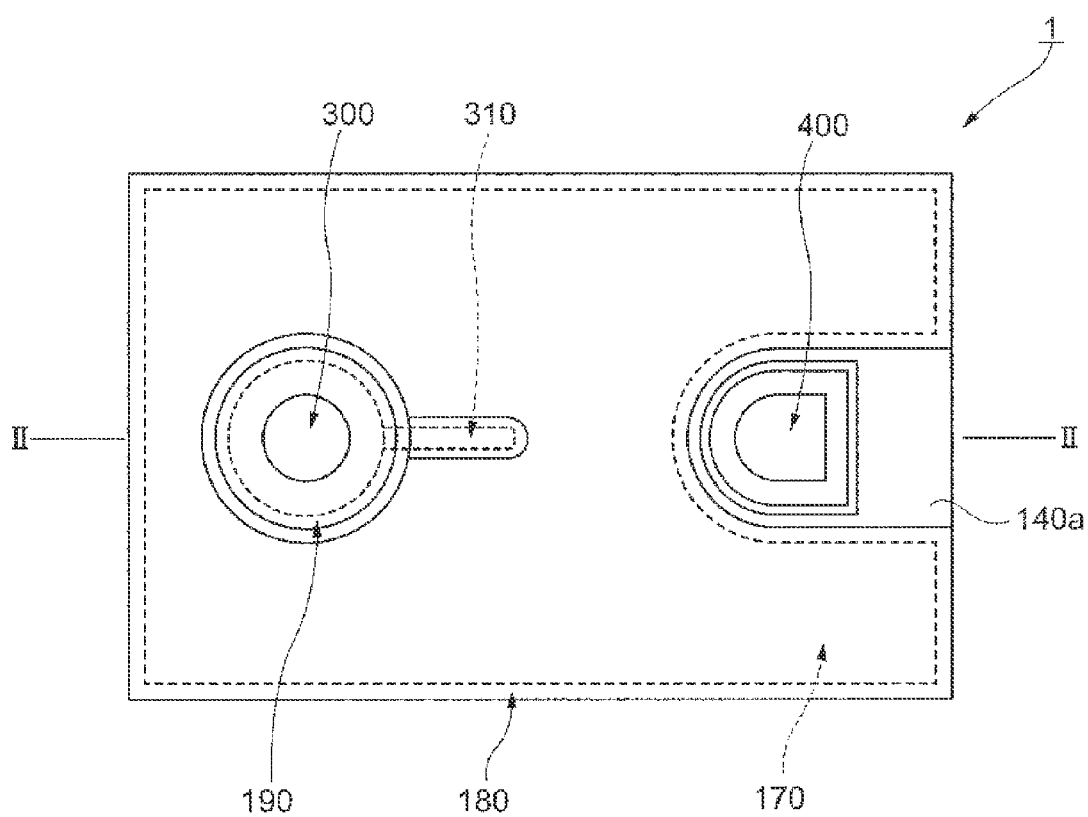
FIG. 1 is an example of a top view of a semiconductor light emitting element to which the exemplary embodiment is applied.
Figure 2:
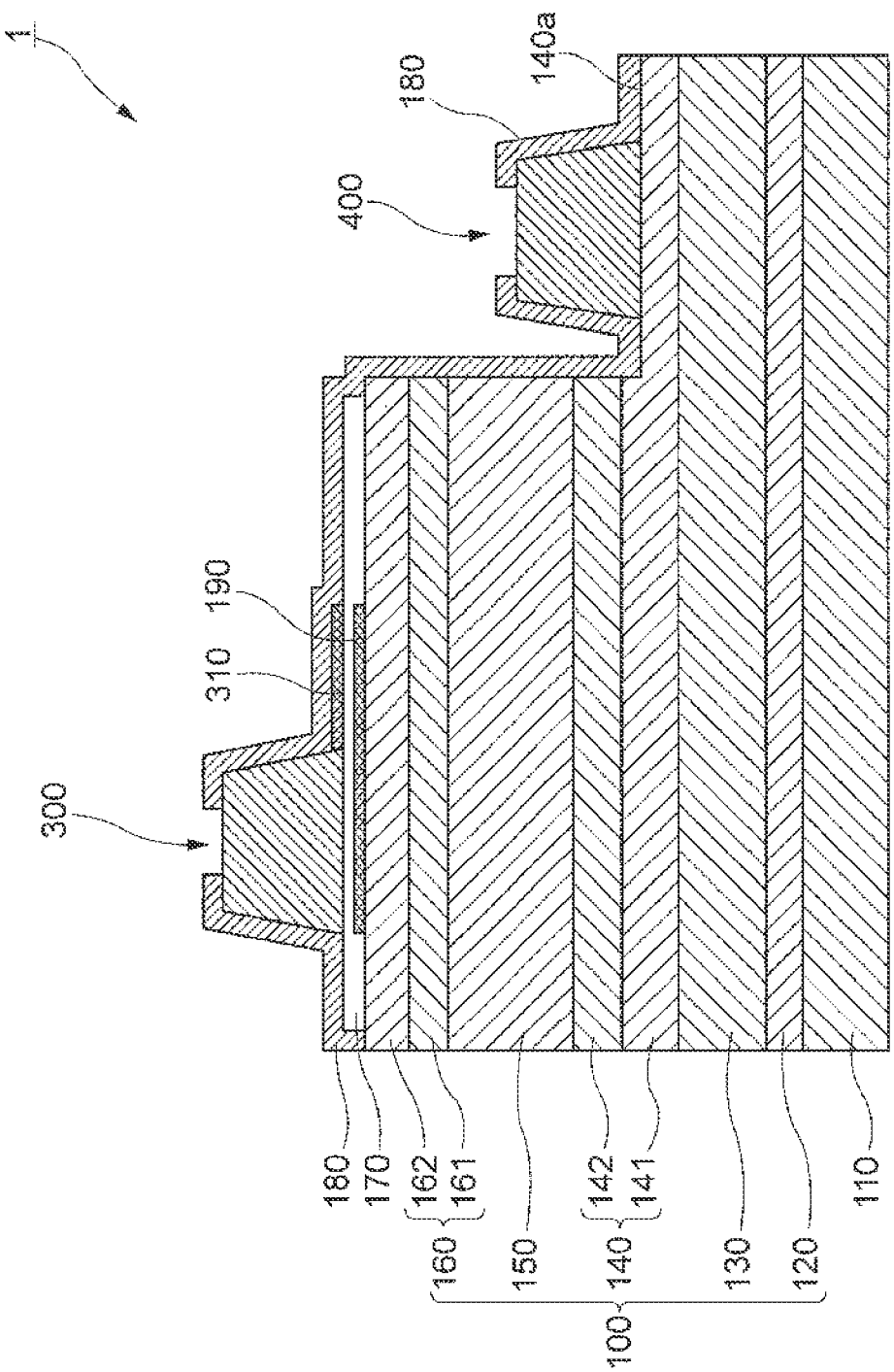
FIG. 2 is a II-II cross-sectional view of the semiconductor light emitting element shown in FIG. 1.

FIG. 1 is an example of a top view of a semiconductor light emitting element (light emitting diode) 1 to which the exemplary embodiment is applied. FIG. 2 is a II-II cross-sectional view of the semiconductor light emitting element 1 shown in FIG. 1.

(Semiconductor Light Emitting Element)

The semiconductor light emitting element 1 includes a substrate 110, an intermediate layer 120 stacked on the substrate 110, and a base layer 130 stacked on the intermediate layer 120. Moreover, the semiconductor light emitting element 1 further includes: an n-type semiconductor layer 140 stacked on the base layer 130; a light emitting layer 150 stacked on the n-type semiconductor layer 140, and a p-type semiconductor layer 160 stacked on the light emitting layer 150. Herein, the n-type semiconductor layer 140 includes: an n-contact layer 141 stacked on the base layer 130; and an n-clad layer 142 stacked on the n-contact layer 141. Moreover, on the n-clad layer 142, the light emitting layer 150 is stacked. On the other hand, the p-type semiconductor layer 160 includes: a p-clad layer 161 stacked on the light emitting layer 150; and a p-contact layer 162 stacked on the p-clad layer 161. In the following description, the intermediate layer 120, the base layer 130, the n-type semiconductor layer 140, the light emitting layer 150, and the p-type semiconductor layer 160 are sometimes collectively called as a laminated semiconductor layer 100 as needed.

The semiconductor light emitting element 1 further includes: a transparent conductive layer 170 stacked on the p-type semiconductor layer 160 (more specifically, on the p-contact layer 162); and a p-side electrode 300 stacked on a part of the transparent conductive layer 170; and a transparent insulating layer 190 provided between the p-type semiconductor layer and the transparent conductive layer 170. Herein, the transparent insulating layer 190 is located under the p-side electrode 300 in the cross-sectional view shown in FIG. 2. The p-side electrode 300 includes an extension portion 310 which is linearly formed from the edge thereof along the upper surface of the transparent conductive layer 170.

The semiconductor light emitting element 1 further includes an n-side electrode 400 stacked on a part of a semiconductor exposed surface 140a of the n-type semiconductor layer 140. The semiconductor exposed surface 140a is exposed by removing a part of the p-type semiconductor layer 160, light emitting layer 150, and n-type semiconductor layer 140 in the laminated semiconductor layer 100. In the semiconductor exposed surface 140a, the contact layer 141 of the n-type semiconductor layer 140 is exposed.

The semiconductor light emitting element 1 further includes a protective layer 180. The protective layer 180 is stacked so as to cover a region of the transparent conductive layer 170 where the p-side electrode 300 is not attached, a region except a part of the p-side electrode 300, a region of the semiconductor exposed surface 140a where the n-side electrode 400 is not attached, and a region except a part of the n-side electrode 400. The protective layer 180 also covers wall surfaces of the n-type semiconductor layer 140, light emitting layer 150, and p-type semiconductor layer 160, which are exposed by partially removing of the p-type semiconductor layer 160, light emitting layer 150, and n-type semiconductor layer 140.

In this semiconductor light emitting element 1, the light emitting layer 150 emits light by applying current flow from the p-side electrode 300 to n-side electrode 400 with the p-side and n-side electrodes 300 and 400 set to the positive and negative electrodes, respectively.

The semiconductor light emitting element 1 of the exemplary embodiment is a face-up type light emitting diode in which light outputted from the light emitting layer 150 is extracted from the side where the p-side and n-side electrodes 300 and 400 are formed.

Next, each constituent elements of the semiconductor light emitting element 1 is described in more detail.

Figure 3:
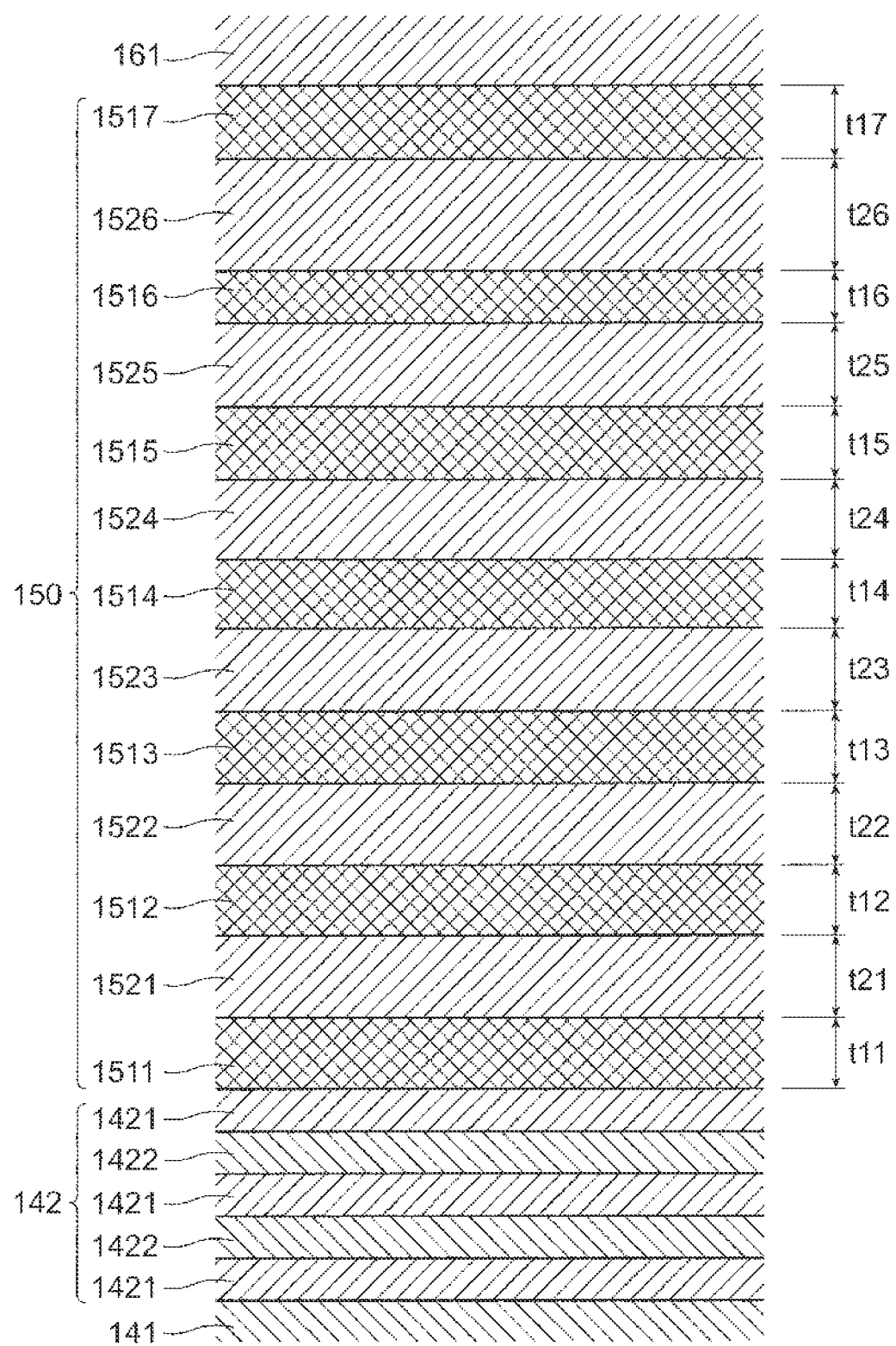
FIG. 3 is an enlarged cross-sectional view around the light emitting layer in the semiconductor light emitting element.

Herein, FIG. 3 is an enlarged cross-sectional view around the light emitting layer 150 in the semiconductor light emitting element 1. Hereinafter, the configuration of the semiconductor light emitting element 1 is described with reference to FIG. 3 in addition to FIGS. 1 and 2.

In the following description, AlGaN, GaN, and GaInN as examples of the group-III nitride semiconductor are described without composition ratios in some cases.

<Substrate>

The substrate 110 is not particularly limited and may be selected from various types of substrates. For example, the substrate 110 may be composed of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium oxide, tungsten oxide, molybdenum oxide, or the like.

Among the aforementioned substrate materials, it is preferable to use a sapphire substrate whose major surface is composed of C plane. When the substrate 110 is composed of a sapphire substrate, the intermediate layer 120 (buffer layer) may be formed on the C plane of sapphire.

Furthermore, the substrate 110 used in the present invention may be preferably composed of a processed substrate described in Japanese Patent Laid-open Publication No. 2009-123717 (a substrate with the surface including a plane composed of C plane of a sapphire single crystal and plural protrusions not parallel to the plane), for example.

<Laminated Semiconductor Layer>

The laminated semiconductor layer 100 is a layer composed of group-III nitride semiconductors, for example. As shown in FIG. 2, the laminated semiconductor layer 100 includes the intermediate layer 120, base layer 130, n-type semiconductor layer 140, light emitting layer 150, and p-type semiconductor layer 160, which are stacked on the substrate 110 in this order. Herein, the n-type semiconductor layer 140 uses electrons as the carriers, and the p-type semiconductor layer 160 uses holes as the carriers.

Hereinbelow, the individual layers constituting the laminated semiconductor layer 100 are sequentially described.

[Intermediate Layer]

The intermediate layer 120 has a function of absorbing the difference in lattice constant between the substrate 110 and the base layer 130. Especially in the case where the substrate 110 is composed of sapphire with the principal surface made of C-plane, the intermediate layer 120 has a function of facilitating formation of a c-axis oriented single-crystal layer on (0001) plane (C-plane) of the substrate 110. Accordingly, if the base layer 130 composed of a single crystal is stacked on the intermediate layer 120, the crystallinity of the base layer 130 may be improved. In the present invention, the intermediate layer 120 is preferably formed but is not necessarily formed.

The intermediate layer 120 is preferably made of polycrystalline $Al_xGa_{1-x}N$ ($0 \leq x \leq 1$) and more preferably made of single-crystalline $Al_xGa_{1-x}N$ ($0 \leq x \leq 1$).

The intermediate layer 120 may be made of polycrystalline $Al_xGa_{1-x}N$ ($0 \leq x \leq 1$) and have a thickness of 10 to 500 nm, for example. If the thickness of the intermediate layer 120 is less than 10 nm, the effect of the intermediate layer 120 on absorbing the difference in lattice constant between the substrate 110 and the base layer 130 is not obtained sufficiently in some cases. Moreover, if the thickness of the intermediate layer 120 exceeds 500 nm, it takes a longer time to form a film of the intermediate layer 120 and therefore reduces the productivity although the function of the intermediate layer 120 does not change.

The intermediate layer 120 may be composed of a group-III nitride semiconductor having a hexagonal crystal structure. The group-III nitride semiconductor constituting the intermediate layer 120 may have a single-crystal structure and, preferably, has a single-crystal structure. By controlling the growth conditions thereof, the crystal of the group-III nitride semiconductor grows not only upward but also in the in-plane direction to form a single-crystal structure. Accordingly, by controlling the film formation conditions of the intermediate layer 120, the intermediate layer 120 is composed of a crystal of the group-III nitride semiconductor having a single-crystal structure. If the intermediate layer 120 having such a single-crystal structure is formed on the substrate 110, the buffering function of the intermediate layer 120 effectively operates, so that the group-III nitride semiconductor formed thereon becomes a crystal film having good orientation and crystallinity.

Moreover, by controlling the film-formation conditions, the crystal of the group-III nitride semiconductor constituting the intermediate layer 120 is formed as columnar crystal (polycrystal) having hexagonal column-based texture. Herein, the columnar crystal having column-based texture herein refers to a crystalline solid including crystal grains separated by crystal grain boundaries, each crystal grain having a columnar longitudinal profile.

Although the intermediate layer 120 formed by MOCVD has good crystalline nature, a semiconductor having better crystallinity than that formed by MOVCD is formed also by sputtering under optimized conditions.

[Base Layer]

The base layer 130 may be composed of $Al_xGa_yIn_zN$ ($0 \leq x \leq 1$, $0 \leq y \leq 1$, $0 \leq z \leq 1$, $x+y+z=1$). Preferably, the base layer 130 is composed of $Al_xGa_{1-x}N$ ($0 \leq x \leq 1$). This is because the base layer 130 composed of $Al_xGa_{1-x}N$ ($0 \leq x \leq 1$) has good crystallinity.

The thickness of the base layer 130 is preferably not less than 100 nm, more preferably not less than 500 nm, and most preferably not less than 1000 nm (1 µm). The base layer 130 having a thickness of not less than 1000 nm is more likely to have good crystallinity.

In order to improve the crystallinity of the base layer 130, it is desirable that the base layer 130 is not doped with impurities. However, the base layer 130 may be added with acceptor impurities (p-type impurities) or donor impurities (n-type impurities) when the base layer 130 needs to have p-type or n-type conductive properties.

[n-Type Semiconductor Layer]

As described above, the n-type semiconductor layer 140 using electrons as carriers includes the n-contact layer 141 stacked on the base layer 130 and the n-clad layer 142 which is stacked on the n-contact layer 141 and on which the light emitting layer 150 is stacked. The aforementioned base layer 130 may be included in the n-type semiconductor layer 140.

The n-contact layer 141 is a layer on which the n-side electrode 400 is provided. The n-contact layer 141 is preferably composed of a $Al_xGa_{1-x}N$ layer ($0 \leq x < 1$, preferably $0 \leq x \leq 0.5$, and more preferably $1 \leq x \leq 1$).

Preferably, the n-contact layer 141 is doped with n-type impurities. The concentration of the n-type impurities is $1 \times 10^{17}$ to $1 \times 10^{20}/cm^3$ and preferably $1 \times 10^{18}$ to $1 \times 10^{19}/cm^3$. This is preferred in order to keep good ohmic contact with the n-side electrode 400. The n-type impurities, which are not particularly limited, are Si, Ge, Sn, or the like, for example, and preferably Si or Ge.

The thickness of the n-contact layer 141 is set to preferably 500 to 5000 nm (5 µm) and more preferably 1000 to 4000 nm (1 to 4 µm). If the n-contact layer 141 has a thickness within the above range, the crystallinity of the group-III semiconductor is successfully kept.

The n-clad layer 142 is a layer for injection of carriers (herein, electrons) into the light emitting layer 150 and confinement of the carriers. In the present exemplary embodiment, the n-clad layer 142 is configured as a layer including a superlattice structure.

To be more specific, as shown in FIG. 3, for example, the n-clad layer 142 has a structure in which n first clad layers 1421 and n second clad layers 1422 are alternately stacked. Each of the n first clad layers 1421 is composed of a group-III nitride semiconductor and has a thickness of not more than 10 nm. Each of the n second clad layers 1422 is composed of a group-III nitride semiconductor having a different composition from the n-first clad layer 1421 and has a thickness of not more than 10 nm. The n-clad layer 142 has a structure in which each of the n second clad layers 1422 is sandwiched by two of the n first cad layers 1421, and the n first clad layers 1421 are provided at sides to be in contact with the n-contact layer 141 and light emitting layer 150. In this specific example, the thicknesses of the n first and second clad layers 1421 and 1422 are set to 2 nm.

Herein, FIG. 3 shows a case where the n-clad layer 142 is composed of five layers including three n first clad layers 1421 and two n second clad layers 1422 by way of example. However, this is shown just by way of example, and the n-clad layer 142 may be composed of 21 layers including eleven n first clad layers 1421 and ten second clad layers 1422, for example.

In the present exemplary embodiment, the n first clad layers 1421 are composed of GaInN, and the n second clad layers 1422 are composed of GaN. Herein, in the case of forming the n-clad layers 142 including GaInN, it is desirable that GaInN constituting the n first clad layers 1421 have a band gap larger than that of GaInN of the light emitting layer 150. The concentration of In in GaInN constituting the n first clad layers 1421 is desirably 0.5 to 3.0 atm percent. Moreover, instead of the aforementioned configuration, the n first clad layers 1421 and n second clad layers 1422 may be composed of AlGaN and GaN, respectively.

The entire thickness of the n-clad layer 142, which is not particularly limited, is preferably 5 to 500 nm and more preferably 5 to 100 nm. The n-type impurity concentration of the n-clad layer 142 is preferably $1.5 \times 10^{17}$ to $1.5 \times 10^{20}/cm^3$ and more preferably $1.5 \times 10^{18}$ to $1.5 \times 10^{19}/cm^3$. The n-type impurity concentration within this range is preferred in order to maintain the good crystallinity and reduce the operating voltage of the semiconductor light emitting element 1.

[Light Emitting Layer]

The light emitting layer 150 of the present exemplary embodiment has a so-called multiquantum well structure in which barrier layers and well layers are alternately stacked. To be more specific, as shown in FIG. 3, the light emitting layer 150 includes: a first barrier layer 1511 stacked on the n-clad layer 142 (n first clad layer 1421); a first well layer 1521 stacked on the first barrier layer 1511; a second barrier layer 1512 stacked on the first well layer 1521; a second well layer 1522 stacked on the second barrier layer 1512; a third barrier layer 1513 stacked on the second well layer 1522; a third well layer 1523 stacked on the third barrier layer 1513; a fourth barrier layer 1514 stacked on the third well layer 1523; a fourth well layer 1524 stacked on the fourth barrier layer 1514; a fifth barrier layer 1515 stacked on the fourth well layer 1524; a fifth well layer 1525 stacked on the fifth barrier layer 1515; a sixth barrier layer 1516 stacked on the fifth well layer 1525; a sixth well layer 1526 stacked on the sixth barrier layer 1516; a seventh barrier layer 1517 which is stacked on the sixth well layer 1526 and on which the p-clad layer 161 is stacked.

As described above, the light emitting layer 150 of the exemplary embodiment is composed of 13 layers including the seven barrier layers (the first to seven barrier layers 1511 to 1517) and six well layers (the first to sixth well layers 1521 to 1526). Moreover, the light emitting layer 150 has a structure in which each well layer is sandwiched by two of the barrier layers. In the light emitting layer 150, the first barrier layer 1511 is located on the side in contact with the n-type semiconductor layer 140 (the n-clad layer 142), and the seventh barrier layer 1517 is located on the side in contact with the p-type semiconductor layer 160 (the p-clad layer 161).

In the following description, the first to seventh barrier layers 1511 to 1517 in the light emitting layer 150 are collectively called as barrier layers 151 in some cases, and the first to sixth well layers 1521 to 1526 in the light emitting layer 150 are collectively called as well layers 152.

First, a description is given of the thicknesses of the layers constituting the barrier layers and the relationship among them.

In the barrier layers 151, the thicknesses of the first to seventh barrier layers 1511 to 1517 are referred to as a first barrier thickness t11, a second barrier thickness t12, a third barrier thickness t13, a fourth barrier thickness t14, a fifth barrier thickness t15, a sixth barrier thickness t16, and a seventh barrier thickness t17, respectively. In this specific example, the first barrier layer 1511, which is located closest to the n-type semiconductor layer 140 among the first to seventh barrier layers 1511 to 1517, the second to fifth barrier layers 1512 to 1515 following the first barrier layer 1511, and the seventh barrier layer 1517 closest to the p-type semiconductor layer 160 have the same thickness (hereinafter, referred to as a standard barrier thickness t1s) (t11=t12=t13=t14=t15=t17=t1s). On the other hand, the sixth barrier layer 1516, which is located the second closest to the p-type semiconductor layer 160 after the seventh barrier layer 1517 among the first to seventh barrier layers 1511 to 1517, has a thickness (hereinafter, referred to as a minimum barrier thickness t1min) smaller than the standard barrier thickness t1s (t1s>t16=t1min).

In this specific example, the standard barrier thickness t1s and minimum barrier thickness t1min are set to 2.5 nm and 2.0 nm, respectively. Accordingly, an entire barrier thickness t10 (=t11+t12+t13+t14+t15+t16+t17) as the thickness of the entire barrier layer 151 is 17.0 nm. In the present exemplary embodiment, the standard barrier thickness t1s and minimum barrier thickness t1min correspond to a third thickness and a fourth thickness, respectively.

In the following description, the layers having the standard barrier thickness t1s among the first to seventh barrier layers 1511 to 1517, which constitute the barrier layers 151 (the first to fifth barrier layers 1511 to 1515 and the seventh barrier layer 1517 in this specific example), are referred to as standard thickness barrier layers in some cases. Furthermore, the layers having the minimum barrier thickness t1min among the first to seventh barrier layers 1511 to 1517, which constitute the barrier layers 151 (the sixth barrier layer 1516 in this specific example), are referred to as minimum thickness barrier layers in some cases.

Next, a description is given of the thicknesses of the layers constituting the well layers 152 and the relationship among them.

In the well layers 152, thicknesses of the first to sixth well layers 1521 to 1526 are referred to as a first well thickness t21, a second well thickness t22, a third well thickness t23, a fourth well thickness t24, a fifth well thickness t25, and a sixth well thickness t26, respectively. In this specific example, the first well layer 1521, which is located closest to the n-type semiconductor layer 140 among the first to sixth well layers 1521 to 1526, and the second to fifth well layers 1522 to 1525 following the first well layer 1521 have the same thickness (hereinafter, referred to as a standard well thickness t2s) (t21=t22=t23=t24=t25=t2s). On the other hand, the sixth well layer 1526, which is located closest to the p-type semiconductor layer 160 among the first to sixth well layers 1521 to 1526, has a thickness (hereinafter, referred to as a maximum well thickness t2max) larger than the standard well thickness t2s (t2s<t26=t2max).

In this specific example, the standard well thickness t2s and the maximum well thickness t2max are set to 3.0 nm and 4.0 nm, respectively. Accordingly, an entire well thickness t20 (=t21+t22+t23+t24+t25+t26) as the thickness of the entire well layer 152 is 19.0 nm. In this specific example, furthermore, the standard well thickness t2s of the well layers 152 is set larger than the standard barrier thickness t1s of the barrier layers 151. In the present exemplary embodiment, each of the first to fifth well layers 1521 to 1525 corresponds to an n-side well layer, and the sixth well layer 1526 corresponds to a p-side well layer. The standard well thickness t2s and maximum well thickness t2max correspond to a first thickness and a second thickness, respectively.

In the following description, the layers configured to have the standard well thickness t2s among the first to seventh well layers 1521 to 1526, which constitute the well layers 152 (the first to fifth well layers 1521 to 1525 in this specific example), are referred to as standard thickness well layers in some cases. Furthermore, in the following description, the layers configured to have the maximum well thickness t2max among the first to seventh well layers 1521 to 1526, which constitute the well layers 152 (the sixth well layer 1526 in this specific example), are referred to as maximum thickness well layers in some cases.

Next, a description is given of the compositions of the layers constituting the barrier layers 151 and the relationship among them.

In the barrier layers 151, the first to fifth barrier layers 1511 to 1515 and seventh barrier layer 1517, which have the standard barrier thickness t1s, and the sixth barrier layer 1516, which has the minimum barrier thickness t1min, are composed of GaN. In other words, the first to seventh barrier layers 1511 to 1517, which constitute the barrier layers 151, have a same composition regardless of the thicknesses thereof (regardless of whether each barrier layer is the standard thickness barrier layer or the minimum thickness barrier layer).

Next, a description is given of the compositions of the layers constituting the well layers 152 and the relationship among them.

In the well layers 152, the first to fifth well layers 1521 to 1525, which have the standard well thickness t2s, are composed of $Ga_{1-y}In_yN$ (0<y<0.4). In other words, the first to fifth well layers 1521 to 1525 as the standard thickness well layers have the same standard well thickness t2s and have the same composition.

On the other hand, the sixth well layer 1526, which has the maximum well thickness t2max in the well layers 152, is composed of $Ga_{1-z}In_zN$ (z<y<0.4). In other words, the sixth well layer 1526 as the maximum thickness well layer has a different thickness and a different composition from those of the first to fifth well layers 1521 to 1525 as the standard thickness well layers. To be more specific, the sixth well layer 1526 has the maximum well thickness t2max, which is larger than the common standard well thickness t2s of the first to fifth well layers 1521 to 1525, and has a composition with In proportion lower than that of the first to fifth well layers 1521 to 1525.

Herein, the magnitude of y of $Ga_{1-y}In_yN$ (0<y<0.4) constituting the first to fifth well layers 1521 to 1525 (the standard thickness well layers) and the magnitude of z of $Ga_{1-z}In_zN$ (z<y<1) constituting the sixth well layer 1526 (the maximum thickness well layer) are determined by a target emission wavelength of the semiconductor light emitting element 1. In the present exemplary embodiment, it is configured so that the first to fifth well layers 1521 to 1525 and the sixth well layer 1526 both output light of a same wavelength. Herein, the reason for setting the thickness of the first to fifth well layers 1521 to 1525 different from that of the sixth well layer 1526 is because: if the thickness is within a quantum size region less than 10 nm, the quantum confined Stark effect gives a significant influence, and the emission wavelength is determined by not only the band gap energy of the group-III nitride semiconductor constituting the layers but also the thickness thereof.

[p-Type Semiconductor Layer]

The p-type semiconductor layer 160, in which holes serve as carriers, includes: the p-clad layer 161 stacked on the light emitting layer 150; and the p-contact layer 162 which is stacked on the p-clad layer 161 and on which the transparent conductive layer 170 is stacked. The p-contact layer 162 may serve as the p-clad layer 161.

The p-clad layer 161 is a layer for injection of carriers (holes, herein) into the light emitting layer 150 and confinement of the carriers. The composition of the p-clad layer 161 is not particularly limited but needs to provide a band gap energy larger than the light emitting layer 150 for confinement of the carriers within the light emitting layer 150. Preferably, the p-clad layer 161 is composed of $Al_xGa_{1-x}N$ (0<x≤0.4).

The p-clad layer 161 composed of the aforementioned AlGaN is preferred in terms of the confinement of carriers within the light emitting layer 150. The thickness of the p-clad layer 161, which is not particularly limited, is preferably 1 to 400 nm and more preferably 5 to 100 nm.

The p-type impurity concentration of the p-clad layer 161 is preferably $1 \times 10^{18}$ to $1 \times 10^{21}/cm^3$ and more preferably $1 \times 10^{19}$ to $1 \times 10^{20}/cm^3$. The p-type impurity concentration within this range is preferred in order to prevent degradation of the crystallinity in both the p-clad layer 161 and the p-contact layer 162 stacked on the p-clad layer 161.

The p-clad layer 161 may have a superlattice structure similarly to the aforementioned n-clad layer 142. In this case, preferably, the p-clad layer 161 has an alternating structure of AlGaN and AlGaN having a different composition ratio or an alternating structure of AlGaN and GaN having difference in composition.

The p-contact layer 162 is a layer on which the transparent conductive layer 170 is provided. Preferably, the p-contact layer 162 is preferably composed of $Al_xGa_{1-x}N$ (0≤x≤0.4). The Al proportion within this range is preferred in order to maintain good crystallinity and good ohmic contact with the transparent conductive layer 170.

The p-type impurity concentration of the p-contact layer 162 is preferably $1 \times 10^{18}$ to $1 \times 10^{21}/cm^3$ and more preferably $1 \times 10^{19}$ to $5 \times 10^{20}/cm^3$. The p-type impurity concentration of the p-contact layer 162 within this range is preferred in order to maintain the good ohmic contact, prevent cracks, and maintain the good crystallinity. The p-type impurities of the p-clad layer 161 and the p-contact layer 162 are not particularly limited but are preferably Mg, for example.

The thickness of the p-contact layer 162, which is not particularly limited, is preferably 10 to 500 nm and more preferably 50 to 200 nm. The thickness of the p-contact layer 162 in this range is preferred in order to prevent reduction of the emission output from the semiconductor light emitting element 1.

<Transparent Insulating Layer>

As shown in FIG. 2, the transparent insulating layer 190 is stacked on a part of the p-type semiconductor layer 160. As shown in FIG. 1, the transparent insulating layer 190 is formed in a part located under the p-side electrode 300 in a planar view of the semiconductor light emitting element 1. This reduces supply of current to the part of the light emitting layer 150, which is located under the opaque p-side electrode 300, and increases current flowing to the other part of the light emitting layer 150 other than the part under the p-side electrode 300, thus increasing the light emission efficiency. Such a combination is preferred because the light emitting layer 150 of the present exemplary embodiment is more effective in a region of higher current density. However, the present exemplary embodiment is not limited to the above-described form, and the transparent insulating layer 190 may be provided on the transparent conductive layer 170. Moreover, the position of the transparent insulating layer 190 is not limited to under the p-side electrode 300 and may have an open lattice or tree form. The structure of the transparent insulating layer 190 is not limited and may be any structure including the conventionally-known structure.

Accordingly, the transparent insulating layer 190 is desirably composed of a material that is transparent to at least the emission wavelength of the light emitting layer 150 and has a low refractive index so that light reflection is increased on the interface between the p-contact layer 162 and transparent insulating layer 190. As for the electric characteristics, it is preferable that the transparent insulating layer 190 is insulating. However, the transparent insulating layer 190 is not necessarily composed of an insulator as long as the contact resistance between the p-contact layer 162 and the transparent insulating layer 190 is higher than that between the p-contact layer 162 and the transparent conductive layer 170. Examples of the transparent and insulating material constituting the transparent insulating layer 190 having a low refraction index include metallic oxides and nitrides such as $SiO_2$ (silicon dioxide), SiN (silicon nitride), $Al_2O_3$ (aluminum oxide), and titanium oxide. It is also preferable that the transparent insulating layer 190 has a structure of a multilayer film including layers of these materials and having a high reflectivity.

Desirably, the transparent insulating layer 190 is at least thick enough to ensure the insulating properties and reflect light on the interface. Moreover, in the light of production, it is desirable that the transparent insulating layer 190 is thin enough to eliminate the possibilities of an increase in cost and disconnection of the transparent conductive layer 170. Specifically, the thickness of the transparent insulating layer 190 is 20 to 500 nm and more desirably 50 to 300 nm.

<Transparent Conductive Layer>

As shown in FIG. 2, the transparent conductive layer 170 is stacked on the p-type semiconductor layer 160.

As shown in FIG. 1, in a planar view of the semiconductor light emitting element 1, the transparent conductive layer 170 (for example, indicated by a dashed line in FIG. 1) is formed so as to cover substantially the entire top surface of the p-type semiconductor layer 160 which is partially removed by a means such as etching to form the n-side electrode 400. However, the shape of the transparent conductive layer 170 is not limited to this shape and also may be an open lattice or tree form. The structure of the transparent conductive layer 170 is not limited and may be any structure including the conventionally-known structure.

Preferably, the transparent conductive layer 170 has a small contact resistance with the p-type semiconductor layer 160. Moreover, in the semiconductor light emitting element 1 of the present exemplary embodiment, since light from the light emitting layer 150 is extracted through the side in which the p-side electrode 300 is formed, it is preferable that the transparent conductive layer 170 has an excellent transparency to the light emitted from the light emitting layer 150. Furthermore, it is preferable that the transparent conductive layer 170 has an excellent conductivity in order that current is uniformly spread all over the surface of the p-type semiconductor layer 160.

Accordingly, the material of the transparent conductive layer 170 is preferably a translucent conductive material composed of a conductive oxide containing at least In. Examples of the conductive oxide containing In are ITO (indium tin oxide ($In_2O_3$—$Sn_2$)), IZO (indium zinc oxide ($In_2O_3$—ZnO)), IGO (indium gallium oxide ($In_2O_3$—$Ga_2O_3$)), ICO (indium cilium oxide ($In_2O_3$—$CnO_2$), and the like. The aforementioned oxides may be added with impurities such as fluorine, for example.

The transparent conductive layer 170 is formed by providing the aforementioned materials using a conventional method well known in this technical field. After the transparent conductive layer 170 is formed, heat treatment is performed for the purpose of making the transparent conductive layer 170 transparent in some cases.

In the present exemplary embodiment, the transparent conductive layer 170 may be made of a material having a crystallized structure and may be composed of a transparent material containing $In_2O_3$ crystal having a hexagonal crystalline structure or bixbyite structure in particular (ITO, IZO, or the like, for example).

For example, in the case of using IZO containing hexagonal $In_2O_3$ crystal to form the transparent conductive layer 170, amorphous IZO film which is excellent to be etched is processed into a specific shape. Furthermore, by heating the amorphous IZO film to transfer the amorphous state to a structure including crystal, the film is processed into an electrode more translucent than the amorphous IZO film. The thickness of the transparent conductive layer 170 is not particularly limited but is preferably in a range of 10 to 500 nm, for example.

<Protective Layer>

The protective layer 180 is provided to prevent intrusion of water and the like into the semiconductor light emitting element 1. In the present exemplary embodiment, since the light from the light emitting layer 150 is extracted through the protective layer 180, it is desirable that the protective layer 180 is excellent in transparency to the light emitted from the light emitting layer 150. In the present exemplary embodiment, therefore, the protective layer 180 is composed of $SiO_2$. The material of the protective layer 180 is not limited to $SiO_2$ and, instead of $SiO_2$, may be $TiO_2$, $Si_3N_4$, $SiO_2$—$Al_2O_3$, $Al_2O_3$, AlN, or the like.

<p-Side Electrode>

The p-side electrode 300 is composed of stacked layers of plural kinds of metal. The p-side electrode 300 of the present exemplary embodiment serves as a so-called bonding pad, and the surface thereof exposed to the outside is connected to a not-shown bonding wire.

The p-side electrode 300 is formed anywhere on the transparent conductive layer 170. For example, the p-side electrode 300 may be formed at a position distant from the n-side electrode 400 or may be formed at the central position of the semiconductor light emitting element 1. However, it is not preferable if the p-side electrode 300 is formed too close to the n-side electrode 400 because bonding wires or balls are short-circuited at the process of bonding.

In this specific example, in the planer view shown in FIG. 1, the p-side electrode 300 has a circular shape. However, the shape thereof is not limited to the circular shape and may be an arbitrary shape such as a polygonal shape, for example.

In order to uniformly supply current to the light emitting layer 150, in this specific example, the p-side electrode 300 is provided with the extension portion 310 having a thin linear shape. The extension portion 310 may be designed into a preferable shape, such as preferable length, thickness, and number, depending on the size and shape of the light emitting layer 150.

<n-Side Electrode>

The n-side electrode 400 is composed of staked layers of plural kinds of metal similarly to the p-side electrode 300. The n-side electrode 400 of the present exemplary embodiment serves as a so-called bonding pad, and the surface thereof exposed to the outside is connected to a not-shown bonding wire.

In this specific example, the n-side electrode 400 is semi-circular in a planar view shown in FIG. 1, but similarly to the p-side electrode 300 described above, may have an arbitrary shape such as a circular or polygonal shape, for example.

From the same perspective as the aforementioned p-side electrode 300, in order to uniformly supply current to the light emitting layer 150, it is desirable that the n-side electrode 400 is provided with a thin-linear extension portion. The thin-linear extension portion for the n-side electrode 400 may be also designed into a preferable shape, such as preferable length, thickness, and number depending on the size and shape of the light emitting layer 150.

(Light Emitting Device)

Figure 4A:
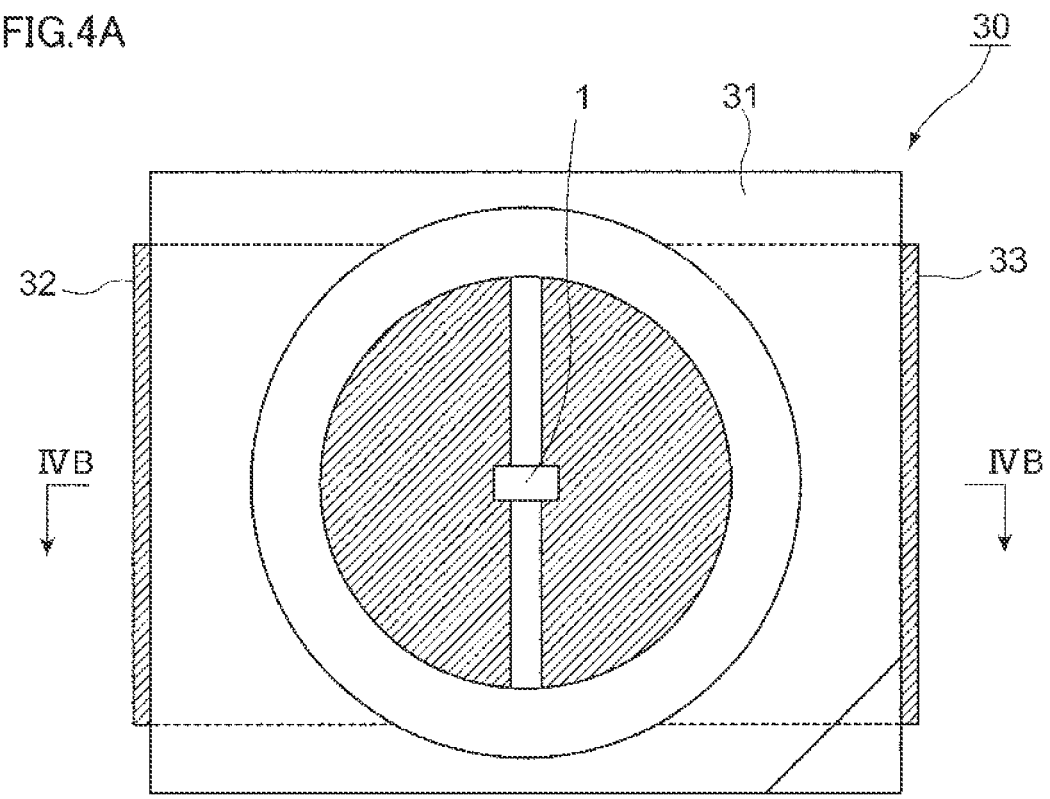
FIGS. 4A and 4B are views showing an example of the configuration of a light emitting device including the aforementioned semiconductor light emitting element.
Figure 4B:
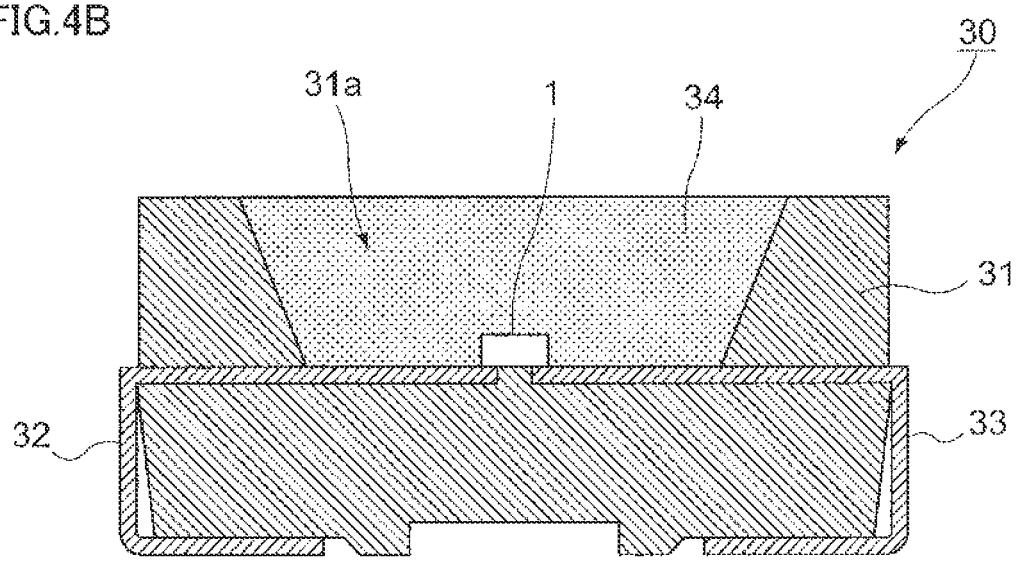

FIGS. 4A and 4B are views showing an example of the configuration of a light emitting device 30 including the aforementioned semiconductor light emitting element 1. FIG. 4A is a top view of the light emitting device 30, and FIG. 4B is an IVB-IVB cross-sectional view of FIG. 4A. The light emitting device 30 shown in FIGS. 4A and 4B is sometimes called a light emitting chip or a lamp.

The light emitting device 30 includes a casing 31, a p-lead portion 32, an n-lead portion 33, the semiconductor light emitting element 1, and a seal portion 34. The casing 31 includes a recessed portion 31a formed on one side. The p- and n-lead portions 32 and 33 are composed of a lead flame formed on the casing 31. The semiconductor light emitting element 1 is attached to the bottom surface of the recessed portion 31a. The seal portion 34 is provided so as to cover the recessed portion 31a. In FIG. 4A, the seal portion 34 is not shown.

The casing 31 is formed by injecting white thermoplastic resin on a metallic lead part including the p-lead portion 32 as an example of a first wire and the n-lead portion 33 as an example of a second wire.

The p- and n-lead portions 32 and 33 are metallic plates each having a thickness of about 0.1 to 0.5 mm. Each of the p- and n-lead portions 32 and 33 is composed of a base material of metal having excellent workability and heat conduction and a plated layer stacked thereon. The metal of the base material is iron-copper alloy, for example. The plated layer is composed of a several micron-thick layer of nickel, titanium, gold, silver or the like. In the present exemplary embodiment, the p- and n-lead portions 32 and 33 are partially exposed in the bottom surface of the recessed portion 31a. One end of each of the p- and n-lead portions 32 and 33 is exposed to the outside of the casing 31 and is bent along the outside wall surface of the casing 31 to the rear surface.

Moreover, the semiconductor light emitting element 1 is attached to the center of the bottom of the recessed portion 31a by an adhesive or the like with the substrate 110 (see FIG. 2) interposed therebetween. Furthermore, the p-lead portion 32 and the p-side electrode 300 (see FIG. 1) of the semiconductor light emitting element 1 are electrically connected by a not-shown bonding wire. The n-lead portion 33 and the n-side electrode 400 (see FIG. 1) of the semiconductor light emitting element 1 are electrically connected by a not-shown bonding wire.

The seal portion 34 is composed of a transparent resin having high light transparency at wavelengths in the visible region. The seal portion 34 is composed of metal satisfying the characteristics of high heat resistance, high weatherability, and high mechanical strength, and examples thereof include epoxy resin and silicon resin. In the present exemplary embodiment, the transparent resin constituting the seal portion 34 contains a fluorescent material that converts a part of light emitted from the semiconductor light emitting element 1 to green and red light. Instead of the aforementioned fluorescent material, the transparent resin may contain a fluorescent material which converts a part of blue light to yellow light or converts a part of blue light to yellow and red light. Moreover, the seal portion 34 may be composed of a transparent resin not containing a fluorescent material.

Electronic devices incorporating the light emitting device 30 of the present exemplary embodiment, such as backlights, mobile phones, displays, various types of panels, computers, game machines, and lamps, mechanical apparatuses incorporating the above electronic devices, such as automobiles, each include the semiconductor light emitting element 1 having excellent emission characteristics. Especially concerning electronic devices driven by batteries, such as backlights, mobile phones, displays, game machines, and lumps, excellent products including the semiconductor light emitting element 1 having excellent emission characteristics may be provided, which is preferable. Moreover, the configuration of the light emitting device 30 including the semiconductor light emitting device 1 is not limited to the example shown in FIG. 4 and may be a package configuration called a shell type, for example.

A description is given of the light emission operation of the light emitting device 30 shown in FIG. 4 with reference to FIGS. 1 to 4.

When voltage (forward voltage VF) with the high potential set to the p-side electrode 300 and the low potential set to the n-side electrode 400 is applied to the semiconductor light emitting element 1 through the p- and n-lead portions 32 and 33 provided for the light emitting device 30, in the semiconductor light emitting element 1, current flows from the p-side electrode 300 through the p-type semiconductor layer 160, light emitting layer 150, and n-type semiconductor layer 140 to the n-side electrode 400 (forward current IF), and the light emitting layer 150 outputs light of a target wavelength (blue light in this specific example).

The light outputted from the light emitting element 150 is outputted to the outside of the semiconductor light emitting element 1 and is then partially converted to different colors (red and green) by the fluorescent material contained in the seal portion 34. Thereafter, the light including blue, green, and red light is directly or is reflected on the inner wall surface provided for the recessed portion 31a of the casing 31 and then outputted through the upper surface of the seal portion 34 to the outside of the light emitting device 30.

During the above process, light is outputted in the following manner in the semiconductor light emitting element 1.

First, the forward current IF flows from the p-side electrode 300 through the p-type semiconductor layer 160, light emitting layer 500, n-type semiconductor layer 140 toward the n-side electrode 400. At this time, holes as carriers are supplied from the p-type semiconductor layer 160 to the light emitting layer 150, and electrons as carriers are supplied from the n-type semiconductor layer 140 to the light emitting layer 150.

In the light emitting layer 150, holes move from the seventh barrier layer 1517 toward the first barrier layer 1511, and electrons move from the first barrier layer 1511 toward the seventh barrier layer 1517. The holes and electrons moving in the light emitting layer 150 are confined in the first to sixth well layers 1521 to 1526 and are recombined with each other. This recombination includes emitting recombination accompanied with light emission and non-emitting recombination not accompanied with light emission. The holes and electrons thus undergo light-emitting recombination to output light (blue light in this specific example).

Herein, it is known that in group-III nitride semiconductors, the mobility of holes is lower than that of electrons. Accordingly, the holes in the well layers 152 of the light emitting layer 150 are distributed in such a manner that the density of holes is the highest in the sixth well layer 1526, which is the closest to the p-type semiconductor layer 160 (the most distant from the n-type semiconductor layer 140), and is sequentially lowered in the fifth to first well layers 1525 to 1521 as the layers are more distant from the p-type semiconductor layer 160 (closer to the n-type semiconductor layer 140). On the other hand, in the well layers 152 of the light emitting layer 150, electrons are distributed in such a manner that the density thereof does not vary so greatly in the layers (the first to sixth well layers 1521 to 1526) from the first well layer 1521, which is the closest to the n-type semiconductor layer 140 (the most distant from the p-type semiconductor layer 160), to the sixth well layer 1526, which is the closest to the p-type semiconductor layer 160 (the most distant from the n-type semiconductor layer 140).

Accordingly, the aforementioned recombination process is the most likely to occur in the sixty well layer 1526, which is the closest to the p-type semiconductor layer 160, and is the most unlikely to occur in the first well layer 1521, which is the closest to the n-type semiconductor layer 140.

Some of the electrons, which have higher mobility than the holes, sometimes directly reach the p-type semiconductor layer 160 without being recombined with the holes in the light emitting layer 150 (the well layers 152). This phenomenon is called overflow.

In the present exemplary embodiment, in the first to sixth well layers 1521 to 1526, which constitute the well layers 152, the sixth well thickness t26 of the sixth well layer 1526, which is the closest to the p-type semiconductor layer 160, is set to the maximum well thickness t2max, which is larger than the first to fifth well thicknesses t21 to t25 (the standard well thickness t2s) of the other first to fifth well layers 1521 to 1525. Accordingly, the amount of holes existing in the sixth well layer 1526 increases compared to the case where the sixth well thickness t26 of the sixth well layer 1526 is set equal to the standard well thickness t2s. The amount of electrons recombined with holes in the sixth well layer 1526 therefore increases, and the aforementioned electron overflow is therefore prevented. Consequently, the amount of electrons recombined with holes to emit light increases compared to the case of not having the aforementioned structure, thus increasing the light emission efficiency of the semiconductor light emitting element 1 and increasing the emission output Po from the semiconductor light emitting element 1.

In the present exemplary embodiment, in the first to sixth well layers 1521 to 1526, which constitute the well layers 152, the first well thickness t21 of the first well layer 1521, which is the closest to the n-type semiconductor layer 140, and the second to fifth well thicknesses t22 to t25 of the second to fifth well layers 1522 to 1525 following the first well layer 1521 are smaller than the sixth well thickness t26 of the sixth well layer 1526 and are set to the common (constant) standard well thickness t2s. Compared to the case where the first to fifth well thicknesses t21 to t25 of the first to fifth well layer 1521 to 1525 are not the same, the manufacturing process of the semiconductor light emitting element 1 is facilitated. Moreover, this configuration prevents the degradation of the crystallinity of the sixth well layer 1526 as the maximum thickness well layer, which is stacked last among the well layers 152.

Moreover, in the case of using GaInN in the well layers 152, the crystallinity of the layer stacked last among the well layers 152 (the sixth well layer 1526 in this specific example) tends to degrade. This is because, in GaInN, In, which is added a little in Ga, does not easily make a solid solution in the crystal. In this specific example, the first to fifth well layers 1521 to 1525, which are stacked before the sixth well layer 1526, have the same thickness and have the same composition, so that the degradation of the crystallinity of the sixth well layer 1526 is prevented. Along with preventing the degradation of the crystallinity of the sixth well layer 1526, the occurrence of non-emitting recombination in the sixth well layer 1526 is prevented, that is, the occurrence of emitting-recombination relative to recombination in the sixth well layer 1526 is increased. Accordingly, the light emission efficiency of the semiconductor light emitting element 1 is increased, and therefore the emission output Po from the semiconductor light emitting element 1 is increased.

Furthermore, in the present exemplary embodiment, among the first to sixth well layers 1521 to 1526, which constitute the well layers 152, the composition of the group-III nitride semiconductor of the sixth well layer 1526 as the maximum thickness well layer is different from the composition of the group-III nitride semiconductor of each of the first to fifth well layers 1521 to 1526 as the standard thickness well layer. To be more specific, in the present exemplary embodiment, each of the first to sixth well layers 1521 to 1526 is composed of GaInN, and the In concentration of the sixth well layer 1526 is lower than that of the first to fifth well layers 1521 to 1525. Setting the In concentration in this manner also prevents the degradation of the crystallinity in the sixth well layer 1526 as the maximum thickness well layer.

If the first to sixth well layers 1521 to 1526 have a same composition and the sixth well layer 1526 is thicker than the first to fifth well layers 1521 to 1525, compared with the wavelength (common wavelength) of light outputted from each of the first to fifth well layers 1521 to 1525, the wavelength of light outputted from the sixth well layer 1526 is shifted to the longer wavelength side (redshifted) because of the aforementioned quantum confined Stark effect. On the other hand, in the present exemplary embodiment, the composition of the sixth well layer 1526 is configured to include a lower ratio of In than that of the composition (the common composition) of the first to fifth well layers 1521 to 1525 to shift the wavelength of light from the sixth well layer 1526 to the shorter wavelength side (blueshift) so that the wavelength of light outputted from the first to fifth well layers 1521 to 1525 matches the wavelength of light outputted from the sixth well layer 1526. Accordingly, compared to the case of not employing the above configuration, the light emission efficiency and emission output Po of the semiconductor light emitting element 1 are increased, and the unity of the emission wavelength thereof is prevented from degrading. The emission output Po is greatly increased especially in a high current density range in which the forward current IF is high.

Furthermore, in the present exemplary embodiment, among the first to seventh barrier layers 1511 to 1517, which constitute the barrier layers 151, the sixth barrier thickness t16 of the sixth barrier layer 1516, which is adjacent to the sixth well layer 1526 as the maximum thickness well layer on the n-type semiconductor layer 140 side, is set to the minimum barrier thickness t1min, which is smaller than the standard barrier thickness t1s of the other first to fifth barrier layers 1511 to 1515 and seventh barrier layer 1517. Accordingly, the amount of holes moving to the fifth well layer 1525 side through the sixth barrier layer 1516 increases compared to the case where the sixth barrier thickness t16 of the sixth barrier layer 1516 is set equal to the standard barrier thickness t1s. The amount of electrons recombined with holes in the fifth well layer 1525 therefore increases in addition to the sixth well layer 1526, and the aforementioned electron overflow is therefore prevented. Compared to the case of not including the above configuration, the amount of holes recombined with electrons to emit light increases both in the fifth well layer 1525 and sixth well layer 1526, thus further increasing the emission efficiency of the semiconductor light emitting element 1 and further increasing the emission output from the semiconductor light emitting element 1.

In the present exemplary embodiment, the n-clad layer 142 constituting the n-type semiconductor layer 140, that is, the layer on which the light emitting layer 150 is stacked, is configured to have a superlattice structure including the plural n first clad layers 1421 and plural n second clad layers 1422. When the n-clad layer 142 has a superlattice structure, crystalline defects in the n-contact layer 141, on which the n-clad layer 142 is stacked, are less likely to diffuse to upper layers (herein, the light emitting layer 150). Accordingly, the light emitting layer 150 (the quantum well structure including the barrier layers 151 in a seven layer-structure and the well layers 152 in a six layer-structure in this specific example) stacked on the n-clad layer 142 having a superlattice structure has a better crystallinity than that in the case of not employing the aforementioned structure. This prevents occurrence of non-emitting recombination in the first to sixth well layers 1521 to 1526, which constitute the well layers 152, that is, increases the occurrence of light-emitting recombination relative to the recombination in each of the first to sixth well layers 1521 to 1526. Accordingly, the emission efficiency of the semiconductor light emitting element 1 is increased, and the emission output Po from the semiconductor light emitting element 1 is therefore increased.

In the present exemplary embodiment, the first to seventh barrier layers 1511 to 1517 of the barrier layers 151 are composed of GaN, and the first to sixth well layers 1521 to 1526 of the well layers 152 are composed of GaInN. However, the present invention is not limited to this configuration. Specifically, the barrier layers 151 and the well layers 152 need to be individually composed of a group-III nitride semiconductor, and the group-III nitride semiconductor used in the barrier layers 151 needs to have a larger band gap energy than that of the group-III nitride semiconductor used in the well layers 152. Herein, in the case where the first to sixth well layers 1521 to 1526, which constitute the well layers 152, are composed of GaInN, the first to seventh barrier layers 1511 to 1517, which constitute the barrier layers 151, may be composed of $Al_xGa_{1-x}N$ ($0 \leq x < 0.3$), for example.

In the specific example of the above description, the barrier layers 151 constitute a seven-layer structure (the first to seventh barrier layers 1511 to 1517), and the well layers 152 constitute a sixth-layer structure (the first to well layers 1521 to 1526). However, the present invention is not limited to this configuration. In the minimum configuration of the present invention, the barrier layers 151 constitutes a four-layer structure (the first to fourth barrier layers 1521 to 1524); the well layers 152 constitutes a three-layer structure (the first to third well layer 1521 to 1523); the first and second well layers 1521 and 1522 are set to the standard thickness well layers; and the third well layer 1523 is set to the maximum thickness well layer.

EXAMPLES

Hereinafter, the present invention is described in more detail based on Examples. The present invention is not limited to the following examples within the scope of the present invention.

The inventor creates the semiconductor light emitting element 1 by varying the thickness and composition of the barrier layers 151 and well layers 152 of the light emitting layers 150 and performs various evaluations described below.

Herein, Table 1 shows configurations of Examples 1 to 10 of the semiconductor light emitting element 1, and Table 2 shows the configurations of Comparative Examples 1 to 7 of the semiconductor light emitting element 1. Tables 1 and 2 include, for each example, the thicknesses (nm) and compositions of the first to seventh barrier layers 1511 to 1517, which constitute the barrier layers 151, the thicknesses (nm) and compositions of the first to sixth well layers 1521 to 1526, which constitute the well layers 152, the total barrier thickness t10 (total thickness (nm) in the tables) of the barrier layers 151 including the first to seventh barrier layers 1511 to 1517, and the total well thickness t20 (total thickness (nm) in the tables) of the well layers 152 including the first to sixth well layers 1521 to 1526. In Examples and Comparative Examples, the configurations of the substrate 110, the intermediate layer 120, the base layer 130, the n-type semiconductor layer 140, the p-type semiconductor layer 160, the transparent conductive layer 170, the protecting layer 180, the transparent insulating layer 190, the p-side electrode layer 300, and the n-side electrode layer 400 individually are common. The semiconductor light emitting element 1 described in the exemplary embodiment corresponds to Example 9 shown in Table 1. Each arrow shown in Tables 1 and 2 represents a numerical value or the like which is the same as left one.

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| First Barrier Layer 1511 | Thickness (nm) | 2.5 | → | → | → | → | → | → | → | → | → |
|  | Composition | GaN | → | → | → | → | → | → | → | → | → |
| First Well Layer 1521 | Thickness (nm) | 3.0 | → | → | → | → | → | → | → | → | → |
|  | Composition | A | → | → | → | → | → | → | → | → | → |
| Second Barrier Layer 1512 | Thickness (nm) | 2.5 | → | → | → | → | → | → | → | → | → |
|  | Composition | GaN | → | → | → | → | → | → | → | → | → |

TABLE 1-continued

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Second Well Layer 1522 | Thickness (nm) | 3.0 | → | → | → | → | → | → | → | → | → |
| | Composition | A | → | → | → | → | → | → | → | → | → |
| Third Barrier Layer 1513 | Thickness (nm) | 2.5 | → | → | → | → | → | → | → | → | → |
| | Composition | GaN | → | → | → | → | → | → | → | → | → |
| Third Well Layer 1523 | Thickness (nm) | 3.0 | → | → | → | → | → | → | → | → | → |
| | Composition | A | → | → | → | → | → | → | → | → | → |
| Fourth Barrier Layer 1514 | Thickness (nm) | 2.5 | → | → | → | → | → | → | → | → | → |
| | Composition | GaN | → | → | → | → | → | → | → | → | → |
| Fourth Well Layer 1524 | Thickness (nm) | 3.0 | → | → | → | → | → | → | 3.33 | 3.0 | → |
| | Composition | A | → | → | → | → | → | → | B | A | → |
| Fifth Barrier Layer 1515 | Thickness (nm) | 2.5 | → | → | → | → | → | → | → | → | → |
| | Composition | GaN | → | → | → | → | → | → | → | → | → |
| Fifth Well Layer 1525 | Thickness (nm) | 3.0 | → | → | → | → | → | 3.5 | 3.33 | 3.0 | → |
| | Composition | A | → | → | → | → | → | C | B | A | → |
| Sixth Barrier Layer 1516 | Thickness (nm) | 2.5 | → | → | → | → | → | → | → | 2.0 | 1.5 |
| | Composition | GaN | → | → | → | → | → | → | → | → | → |
| Sixth Well Layer 1526 | Thickness (nm) | 3.5 | 4.0 | 4.5 | 5.0 | 6.0 | 7.5 | 3.5 | 3.33 | 4.0 | → |
| | Composition | C | D | E | F | G | H | C | B | D | → |
| Seventh Barrier Layer 1517 | Thickness (nm) | 2.5 | → | → | → | → | → | → | → | → | → |
| | Composition | GaN | → | → | → | → | → | → | → | → | → |
| Barrier Layer 151 | Total Thickness (nm) | 17.5 | → | → | → | → | → | → | → | 17.0 | 16.5 |
| Well Layer 152 | Total Thickness (nm) | 18.5 | 19.0 | 19.5 | 20.0 | 21.0 | 22.5 | 19.0 | → | → | → |

TABLE 2

| | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| First Barrier Layer 1511 | Thickness (nm) | 2.5 | → | → | → | → | → | → |
| | Composition | GaN | → | → | → | → | → | → |
| First Well Layer 1521 | Thickness (nm) | 3.0 | 4.0 | 3.0 | → | → | → | → |
| | Composition | A | D | A | → | → | → | → |
| Second Barrier Layer 1512 | Thickness (nm) | 2.5 | → | → | → | → | → | → |
| | Composition | GaN | → | → | → | → | → | → |
| Second Well Layer 1522 | Thickness (nm) | 3.0 | → | → | → | → | → | → |
| | Composition | A | → | → | → | → | → | → |
| Third Barrier Layer 1513 | Thickness (nm) | 2.5 | → | → | → | → | → | → |
| | Composition | GaN | → | → | → | → | → | → |
| Third Well Layer 1523 | Thickness (nm) | 3.0 | → | 4.0 | 3.0 | → | → | → |
| | Composition | A | → | D | A | → | → | → |
| Fourth Barrier Layer 1514 | Thickness (nm) | 2.5 | → | → | → | → | → | → |
| | Composition | GaN | → | → | → | → | → | → |
| Fourth Well Layer 1524 | Thickness (nm) | 3.0 | → | → | → | → | → | → |
| | Composition | A | → | → | → | → | → | → |
| Fifth Barrier Layer 1515 | Thickness (nm) | 2.5 | → | → | → | → | → | → |
| | Composition | GaN | → | → | → | → | → | → |
| Fifth Well Layer 1525 | Thickness (nm) | 3.0 | → | → | 4.0 | 3.0 | → | → |
| | Composition | A | → | → | D | A | → | → |
| Sixth Barrier Layer 1516 | Thickness (nm) | 2.5 | → | → | → | → | → | 1.0 |
| | Composition | GaN | → | → | → | → | → | → |
| Sixth Well Layer 1526 | Thickness (nm) | 3.0 | → | → | → | 9.0 | 4.0 | → |
| | Composition | A | → | → | → | I | A | D |
| Seventh Barrier Layer 1517 | Thickness (nm) | 2.5 | → | → | → | → | → | → |
| | Composition | GaN | → | → | → | → | → | → |
| Barrier Layer 151 | Total Thickness (nm) | 17.5 | → | → | → | → | → | 16.0 |
| Well Layer 152 | Total Thickness (nm) | 18.0 | 19.0 | → | → | 24.0 | 19.0 | → |

Herein, Compositions A to I shown in Table 1 and 2 are as follows.

Composition A: $Ga_{0.910}In_{0.090}N$
Composition B: $Ga_{0.919}In_{0.081}N$
Composition C: $Ga_{0.925}In_{0.075}N$
Composition D: $Ga_{0.940}In_{0.060}N$
Composition E: $Ga_{0.955}In_{0.045}N$
Composition F: $Ga_{0.965}In_{0.035}N$
Composition G: $Ga_{0.975}In_{0.025}N$
Composition H: $Ga_{0.980}In_{0.020}N$
Composition I: $Ga_{0.982}In_{0.018}N$ Next, a description is given of the evaluation method and results.

Figure 5:
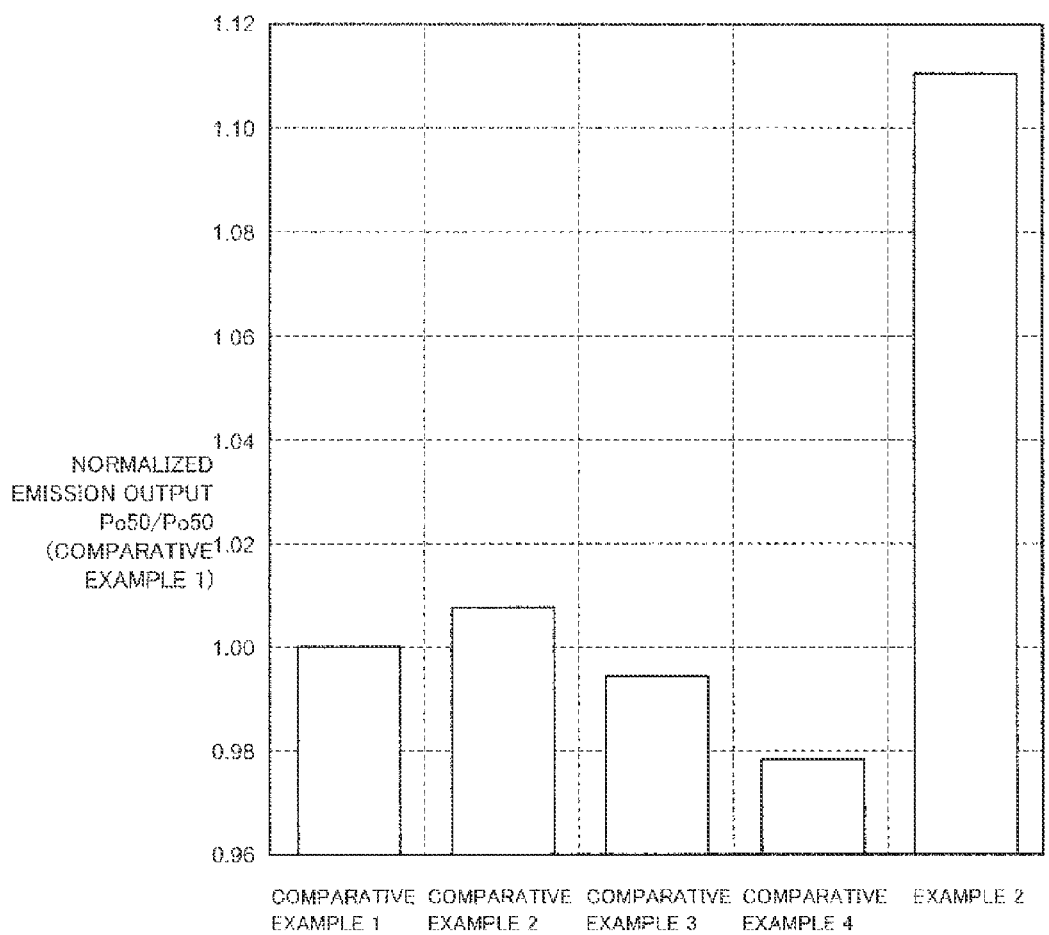
FIG. 5 is a graph diagram illustrating the relationship between the position of the maximum thickness well layer in the light emitting layer and the emission output.

FIG. 5 is a graph diagram illustrating the relationship between the position of the maximum thickness well layer in the light emitting layer and the emission output Po. FIG. 5 describes Comparative Example 1 not including the maximum thickness well layer, Comparative Example 2 in which the first well layer 1521 is the maximum thickness well layer, Comparative Example 3 in which the third well layer 1523 is the maximum thickness well layer, Comparative Example 4 in which the fifth well layer 1525 is the maximum thickness well layer, and Example 2 in which the sixth well layer 1526 is the maximum thickness well layer. FIG. 5 shows the emission output Po (indicated by Po50 in the drawing) when the forward current IF of 50 mA is applied to each example of the semiconductor light emitting element 1. The vertical axis of FIG. 5 represents normalized emission output (indicated by normalized emission output Po50/Po50 (Comparative Example 1) in the drawing) which is obtained by normalizing each result based on the result of Comparative Example 1 not including the maximum thickness well layer in the well layers 152.

FIG. 5 reveals that the emission output Po is larger in the case where the sixth well layer 1526, which is the closest to the p-type semiconductor layer 160, is the maximum thickness well layer (Example 2) than in the case where there is no maximum thickness well layer (Comparative Example 1) and the case where another layer is the maximum thickness well layer (Comparative Examples 2 to 4).

Figure 6A:
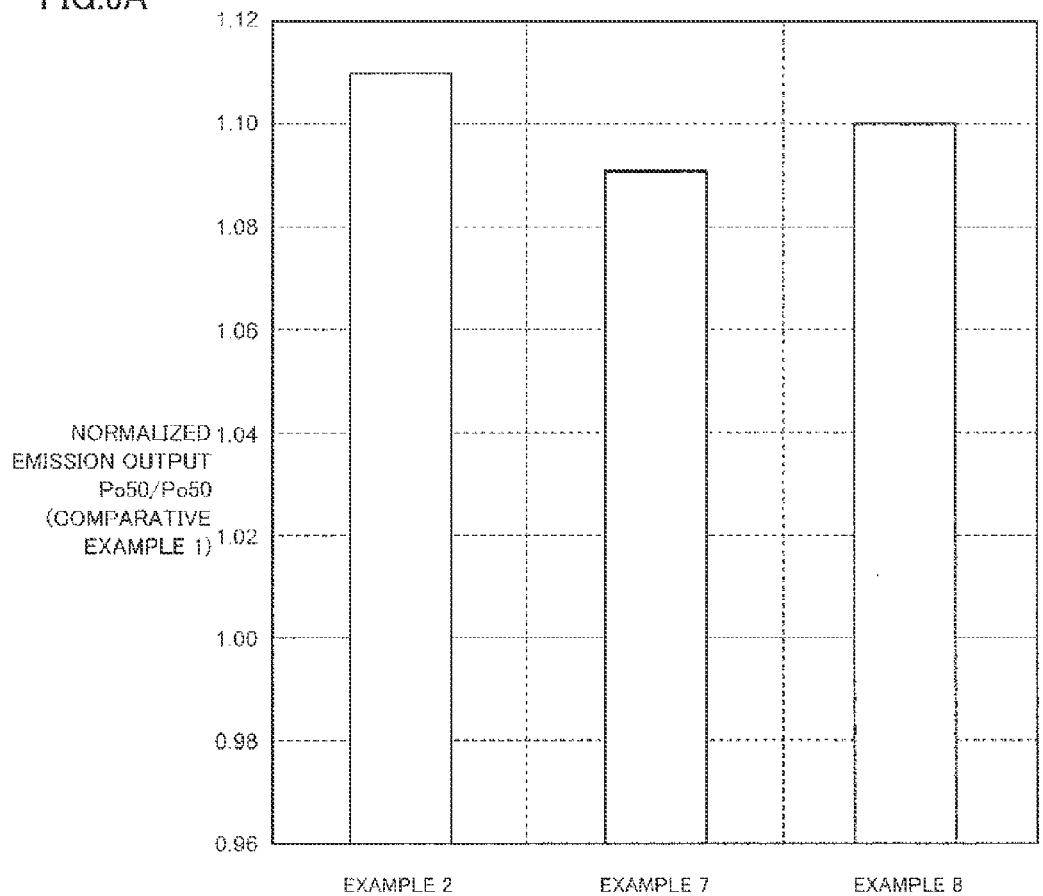
FIG. 6A is a graph diagram illustrating the relationship between the number of maximum thickness well layers in the light emitting layer and the emission output.
Figure 6B:
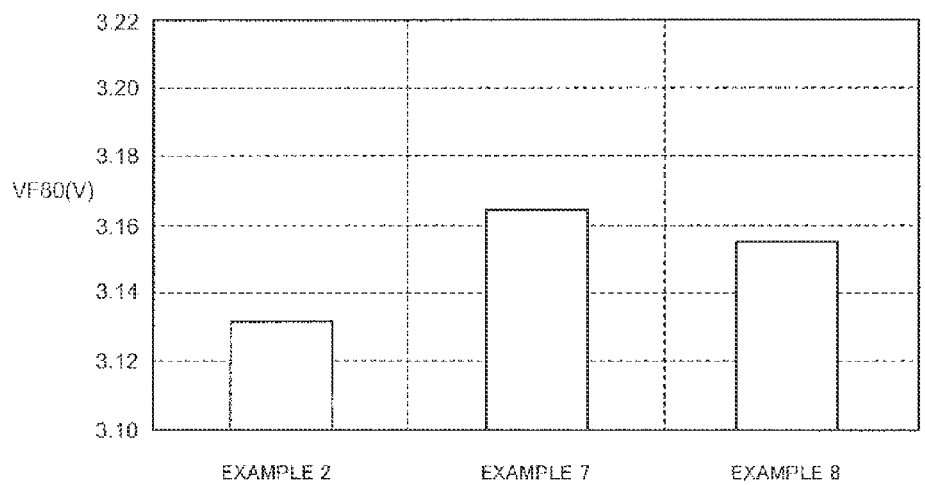
FIG. 6B is a graph diagram illustrating the relationship between the number of maximum thickness well layers in the light emitting layer and the magnitude of the forward voltage.

FIG. 6A is a graph diagram illustrating the relationship between the number of maximum thickness well layers in the light emitting layer 150 and the emission output Po, and FIG. 6B is a graph diagram illustrating the relationship between the number of maximum thickness well layers in the light emitting layer 150 and the magnitude of the forward voltage VF. Herein, FIGS. 6A and 6B describe Example 2 in which only the sixth well layer 1526 is the maximum thickness well layer, Example 7 in which both the sixth and fifth well layers 1526 and 1525 are the maximum thickness well layers, and Example 8 in which three layers of the sixth, fifth, and fourth well layers 1526, 1525, and 1524 are the maximum thickness well layers. FIG. 6A shows the emission output Po (indicated as Po50 in the drawing) when the forward current IF of 50 mA is applied to each example of the semiconductor light emitting element similarly to that shown in FIG. 5. The vertical axis of FIG. 6A represents normalized emission output (indicated by normalized emission output Po50/Po50 (Comparative Example 1) in the drawing) which is obtained by normalizing each result based on the result of Comparative Example 1 including no maximum thickness well layer. The vertical axis of FIG. 6B represents the forward voltage VF (indicated by VF80 (V) in the drawing) when the forward current IF of 80 mA is applied to each example of the semiconductor light emitting element 1.

FIG. 6A reveals that compared to the case with no maximum thickness well layer (Comparative Example 1), the emission output Po is increased in any of the case where only the sixth well layer 1526, which is the closest to the p-type semiconductor layer 160, is the maximum thickness well layer (Example 2), the case where in addition to the sixth well layer 1526, the fifth well layer 1525, which is the second closest to the p-type semiconductor layer 160 after the sixth well layer 1526, is also the maximum thickness well layer (Example 7), and the case where in addition to the sixth and fifth well layers 1526 and 1525, the fourth well layer 1524, which is the third closest to the p-type semiconductor layer 160 after the fifth well layer 1525, is also the maximum thickness well layer (Example 8).

FIG. 6A reveals that the emission output Po is increased in the case where only the sixth well layer 1526, which is the closest to the p-type semiconductor layer 160, is the maximum thickness well layer (Example 2) compared to the case where the fifth and sixth well layers 1525 and 1526 are the maximum thickness well layers (Example 7) and the case where the fourth to sixth well layers 1524 to 1526 are the maximum thickness well layers (Example 8).

On the other hand, FIG. 6B reveals that the forward voltage VF is reduced in the case where only the sixth well layer 1526, which is the closest to the p-type semiconductor layer 160, is the maximum thickness well layer (Example 2) compared to the case where the fifth and sixth well layers 1525 and 1526 are the maximum thickness well layers (Example 7) and the case where the fourth to sixth well layers 1524 to 1526 are the maximum thickness well layers (Example 8).

Figure 7:
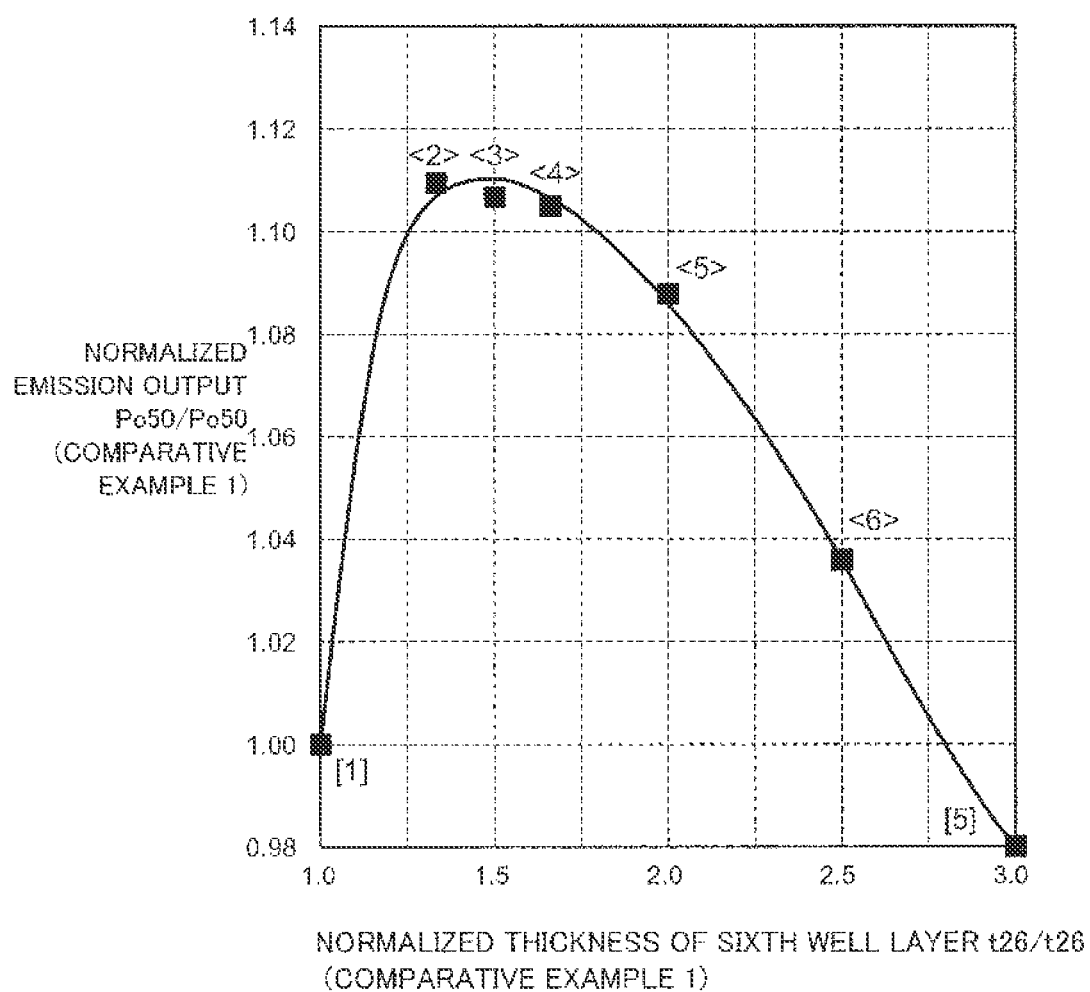
FIG. 7 is a graph diagram illustrating the relationship between the thickness of the sixth well layer as the maximum thickness well layer in the light emitting layer and the emission output.

FIG. 7 is a graph diagram illustrating the relationship between the thickness (the sixth well thickness t26) of the sixth well layer 1526 as the maximum thickness well layer in the light emitting layer 150 and the emission output Po. Herein, FIG. 7 describes Comparative example 1 not including the maximum thickness well layer (indicated by [1] in the drawing), Example 2 with the sixth well thickness t26 (the maximum well thickness t2max) set to 4.0 nm (indicated by <2> in the drawing), Example 3 with the sixth well thickness t26 (the maximum well thickness t2max) set to 4.5 nm (indicated by <3> in the drawing), Example 4 with the sixth well thickness t26 (the maximum well thickness t2max) set to 5.0 nm (indicated by <3> in the drawing), Example 5 with the sixth well thickness t26 (the maximum well thickness t2max) set to 6.0 nm (indicated by <5> in the drawing), Example 6 with the sixth well thickness t26 (the maximum well thickness t2max) set to 7.5 nm (indicated by <6> in the drawing), and Comparative Example 5 with the sixth well thickness t26 set to 9.0 nm (indicated by [5] in the drawing). FIG. 7 shows the emission output Po (indicated by Po50 in the drawing) when the forward current IF of 50 mA is applied to each example of the semiconductor light emitting element 1. The horizontal axis in FIG. 7 represents the normalized thickness which is obtained by normalizing the sixth well thickness t26 in each of Examples and Comparative Examples based on the sixth well thickness t26 (3.0 nm) of Comparative Example 1 (indicated by normalized thickness t26/t26 (Comparative Example 1) of the sixth well layer in the drawing). The vertical axis in FIG. 7 represents normalized emission output (indicated by normalized emission output Po50/Po50 (Comparative Example 1) in the drawing) which is obtained by normalizing each result based on the result of Comparative Example 1 not including the maximum thickness well layer in the well layers 152.

FIG. 7 reveals that: when the sixth well thickness t26=the maximum well thickness t2max and the first to fifth well thicknesses t21 to t25=the standard well thickness t2s, the emission outputs Po is increased in the following range (the range including Examples 2 to 6) compared to the range of the other conditions (the range including Comparative Examples 1 or 5).

$$1 < (t2max/t2s) \leq 2.8 \quad (1)$$

Moreover, FIG. 7 reveals that the emission output Po is further increased in the following range (the range including Examples 2 to 5) among the above range (1), $$1.2 < (t2max/t2s) \leq 2.1 \quad (2)$$

Figure 8A:
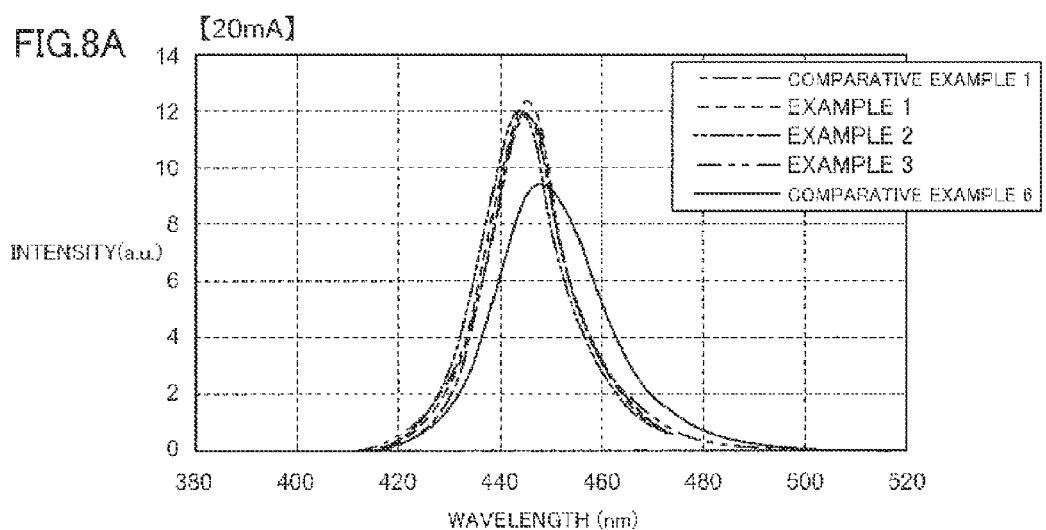
FIGS. 8A to 8C are graph diagrams illustrating the relationship between the composition of the sixth well layer as the maximum thickness well layer in the light emitting layer and the emission wavelength spectrum in terms of the magnitude of the forward current.
Figure 8B:
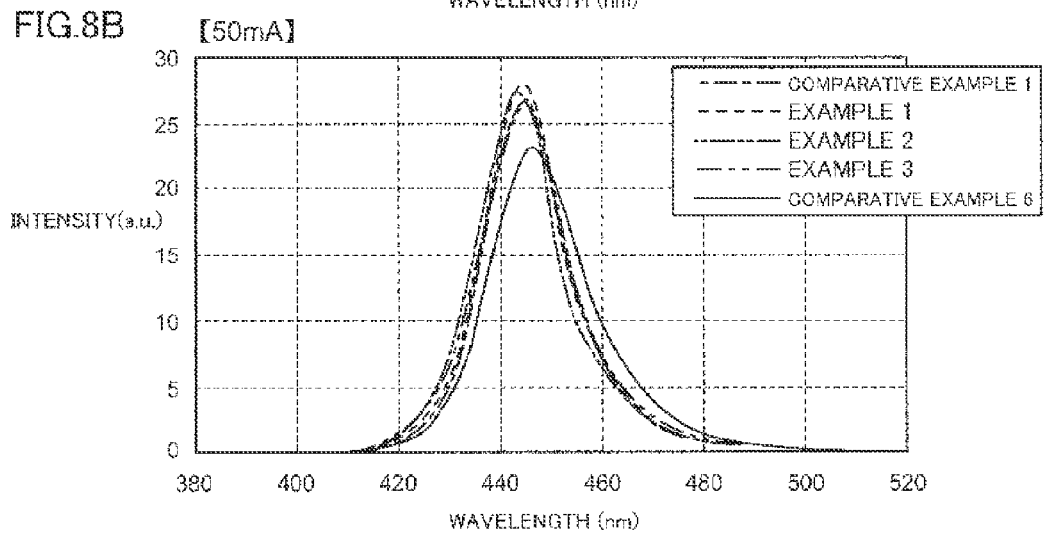
Figure 8C:
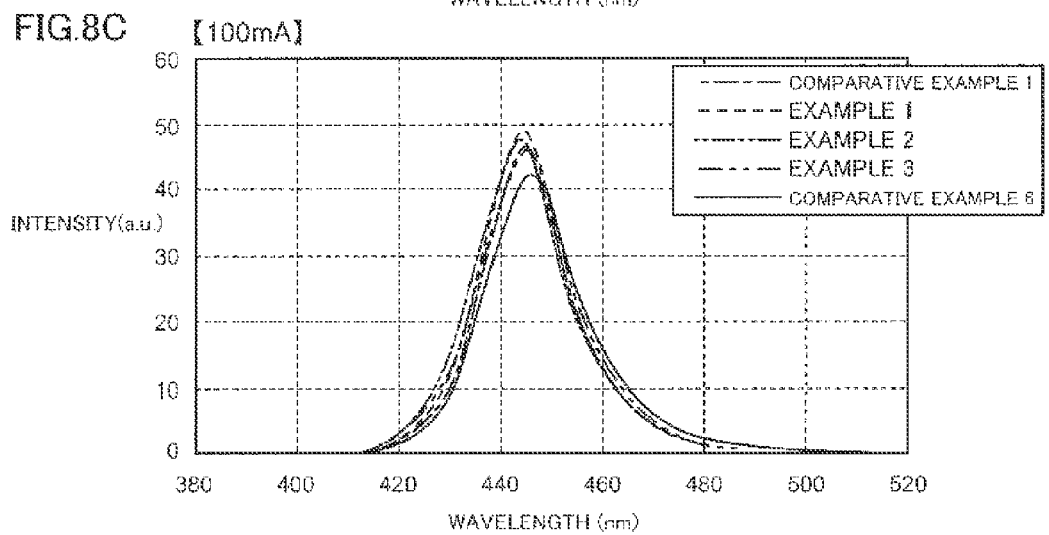

FIGS. 8A to 8C are graph diagrams illustrating the relationship between the composition of the sixth well layer 1526 as the maximum thickness well layer in the light emitting layer 150 and the emission wavelength spectrum in terms of the magnitude of the forward current IF. Herein, FIGS. 8A to 8C respectively show the results with the magnitudes of the forward current IF set to 20 mA, 50 mA, and 100 mA. FIGS. 8A to 8C describe Comparative Example 1 in which the maximum thickness well layer is not included and adjustment of the composition of the sixth well layer 1526 is not necessary, Example 2 in which the sixth well thickness t26 (the maximum well thickness t2max) is set to 4.0 nm and the composition of the sixth well layer 1526 is adjusted, Example 3 in which the sixth well thickness t26 (the maximum well thickness t2max) is set to 4.5 nm and the composition of the sixth well layer 1526 is adjusted, and Comparative Example 6 in which the sixth well thickness t26 is set to 4.0 nm and the composition of the sixth well layer 1526 is not adjusted. In FIGS. 8A to 8C, the horizontal axis represents wavelength (nm). In FIGS. 8A to 8C, the vertical axis represents the intensity of the emission wavelength spectrum by ratio obtained at the same forward current IF (arbitrary unit).

In FIGS. 8A to 8C, from the comparison of the case where the first to fifth well layers 1521 to 1525 have a different thickness and a different composition from those of the six well layer 1526 (Examples 1 to 3) with the case where the first to fifth well layers 1521 to 1525, which constitute the well layers 152, have a same thickness and a same composition (Comparative Example 1), it is found that there is no large difference in sharpness (unity).

In FIGS. 8A to 8C, from the comparison of the case where the first to fifth well layers 1521 to 1525 have different thickness and composition from the six well layer 1526 (Examples 1 to 3) with the case where the first to fifth well layers 1521 to 1525 have a different thickness from the sixth well layer 1526 and have the same composition as the sixth well layer 1526 (Comparative Example 6), it is found that the emission wavelength spectrum of Comparative Example 6 is broader than those of Examples 1 to 3. This is because in Comparative Example 6, the emission wavelength of the first to fifth well layers 1521 to 1525 is different from that of the sixth well layer 1526.

In FIG. 8C, the emission wavelength spectrum of Comparative Example 6 is close to the emission wavelength spectra of Examples 1 to 3. Accordingly, it is considered that with an increase in the forward current IF, the amount of light emitted from the first to fifth well layers 1521 to 1525 increases. As apparent from FIGS. 8A to 8C, Examples 1 to 3 have narrow half-value widths of the emission wavelength spectra of about 20 nm and have desirable characteristics with less dependence on current.

Figures 9A, 9B:
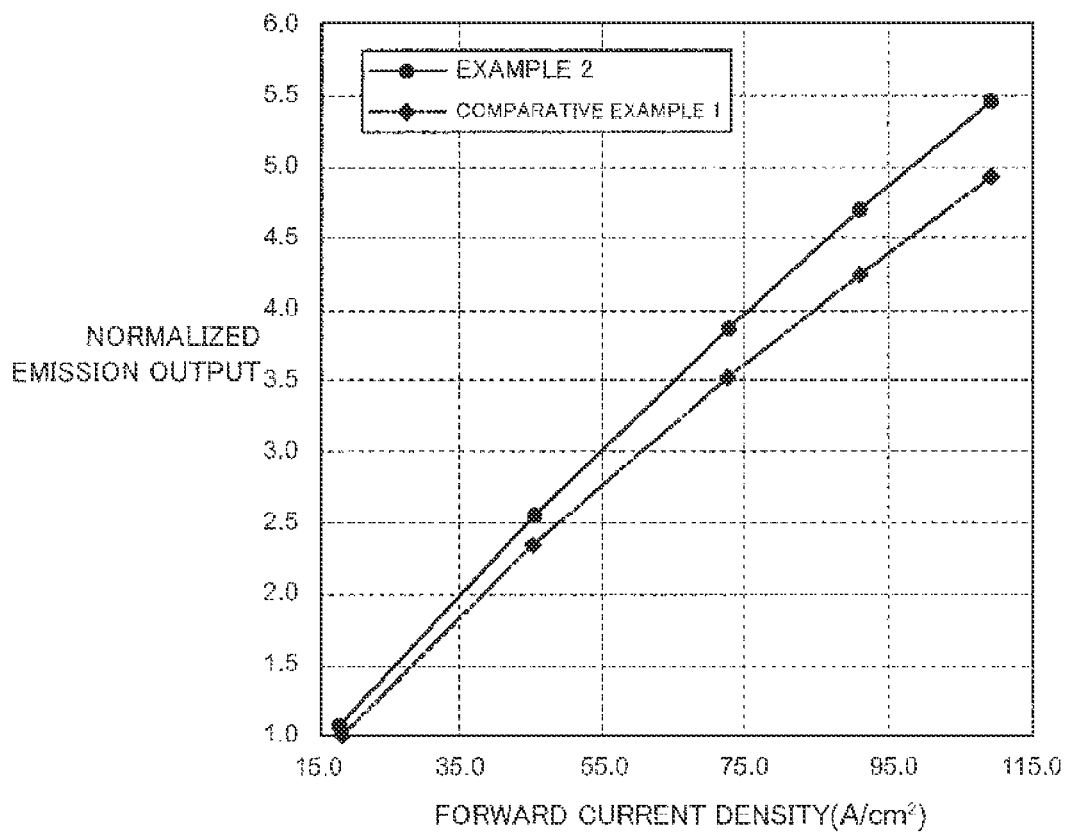
FIGS. 9A and 9B are diagrams for explaining the relationship between the magnitude of the forward current density and the emission output.

FIGS. 9A and 9B are diagrams for explaining the relationship between the magnitude of the forward current density and the emission output Po. FIGS. 9A and 9B respectively showing a graph diagram and a table illustrating the relationship between the magnitude of the forward current density and the normalized emission output. Herein, FIGS. 9A and 9B describe Example 2 in which the sixth well layer 1526 is the maximum thickness well layer and Comparative Example 1 not including the maximum thickness well layer. In FIG. 9A, the horizontal axis represents the forward current density (A/cm$^2$) supplied to the semiconductor light emitting element 1, and the vertical axis represents the normalized emission output which is obtained by normalizing each result based on the result of Comparative Example 1 not including the maximum thickness well layer at a forward current density of 18.2 A/cm$^2$.

In FIGS. 9A and 9B, from the comparison of the case where the first to fifth well layers 1521 to 1525 have a different thickness and a different composition from those of the sixth well layer 1526 (Example 2) with the case where the first to sixth well layers 1521 to 1526, which constitute the well layers 152, have a same thickness and a same composition, it is found that the emission output Po of Example 2 is larger than Comparative Example 1 at a same magnitude of the forward current density. Moreover, as the forward current density increases, the emission output of Example 2 increases at a higher rate (slope) than Comparative Example 1.

Herein, it is desirable that a ratio L (Po2/Po1) of emission output Po1 in a low current range (current density=18.2 A/m$^2$) to emission output Po2 in a high current range (current density=109.2 A/cm$^2$) is not less than 5. In Example 2, L=5.47. In Comparative Example 1, L=4.93.

Furthermore, in addition to the above ratio L, the excellent optical characteristics of the present invention include such a stable characteristic that the half-value width of the emission wavelength spectrum is less than 25 nm in a range from the low to high current region.

Figure 10:
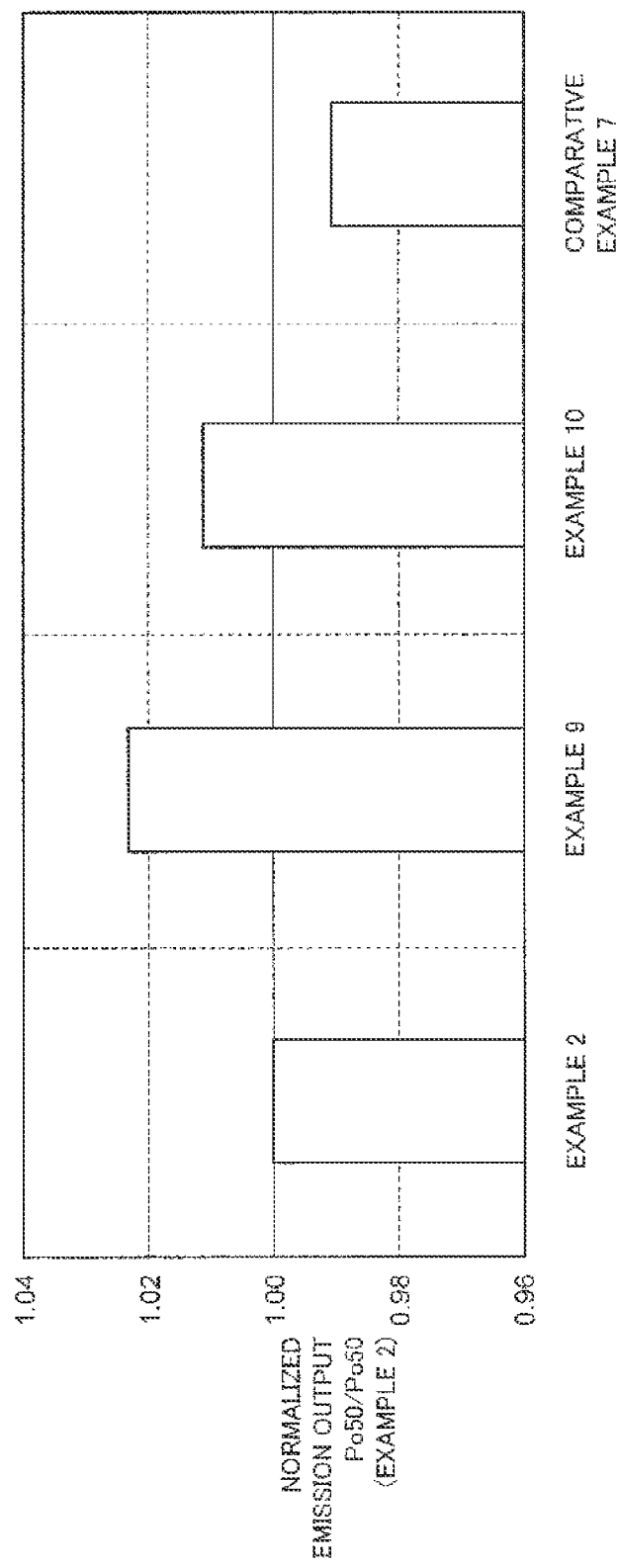
FIG. 10 is a diagram showing the relationship between the thickness of the sixth barrier layer as the minimum thickness barrier layer in the light emitting layer and the emission output.

FIG. 10 is a diagram showing the relationship between the thickness of the sixth barrier layer 1516 as the minimum thickness barrier layer in the light emitting layer 150 and the emission output Po. Herein, FIG. 10 describes Example 2 with the sixth barrier thickness t16 set to 2.5 nm (=standard barrier thickness t1s), Example 9 with the sixth barrier thickness t16 (=minimum barrier thickness t1min) set to 2.0 nm, Example 10 with the sixth barrier thickness t16 (=minimum barrier thickness t1min) set to 1.5 nm, and Comparative Example 7 with the sixth barrier thickness t16 (=minimum barrier thickness t1min) set to 1.0 nm. FIG. 10 shows the emission output Po when a forward current IF of 50 mA is applied to each example of the semiconductor light emitting element 1 (indicated by Po50 in the drawing). In FIG. 10, the vertical axis shows normalized emission output obtained by normalizing each result based on the result of Example 2 not including the minimum barrier layer in the seventh barrier layer 1517 (indicated by normalized emission output Po50/Po50 (Example 2) in the drawing).

In FIG. 10, compared to the case where the first to sixth barrier thicknesses t11 to t16 of the first to sixth barrier layers 1511 to 1516 are the same (Example 2), the emission output Po is increased by reducing the sixth barrier thickness t16 of the sixth barrier layer 1516, which is adjacent to the n-side of the sixth well layer 1526 as the maximum thickness well layer (Examples 9 and 10). However, it is also found that if the sixth barrier thickness t16 of the sixth barrier layer 1516 is excessively reduced (Comparative Example 7), the emission output Po is reduced. This is considered to be because when the sixth barrier thickness t16 is less than 1.5 nm, it is difficult to confine carriers in the fifth and sixth well layers 1525 and 1526.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:
1. A semiconductor light emitting element, comprising:
an n-type semiconductor layer that is composed of a group-III nitride semiconductor containing n-type impurities;
a light emitting layer that is stacked on the n-type semiconductor layer, is composed of a group-III nitride semiconductor, and emits light when being supplied with current; and a p-type semiconductor layer that is stacked on the light emitting layer and is composed of a group-III nitride semiconductor containing p-type impurities, wherein the light emitting layer includes:

three or more well layers that are composed of a group-III nitride semiconductor; and four or more barrier layers that are composed of a group-III nitride semiconductor having a larger band gap than that of the well layers, and are provided such that each of the three or more well layers is sandwiched from both sides by neighboring two of the barrier layers, and that one of the barrier layers at a boundary with the n-type semiconductor layer is connected to the n-type semiconductor layer while another one of the barrier layers at a boundary with the p-type semiconductor layer is connected to the p-type semiconductor layer, and the three or more well layers include:

a plurality of n-side well layers that are provided in order from a side closer to the n-type semiconductor layer, and each of which has a first thickness to emit light of a common wavelength; and one or a plurality of p-side well layers that are provided between a side closer to the p-type semiconductor layer and the n-side well layers, and each of which has a second thickness larger than the first thickness and has a different composition from the n-side well layers to emit light of the common wavelength.

2. The semiconductor light emitting element according to claim 1, wherein the one or plurality of p-side well layers include only one of the well layers that is the closest to the p-type semiconductor layer, and the plurality of n-side well layers include all the well layers except the p-side well layer.

3. The semiconductor light emitting element according to claim 2, wherein, in the four or more barrier layers, all the barrier layers except the barrier layer located between the one or plurality of p-side well layers and the plurality of n-side well layers have a third thickness, and the barrier layer located between the one or plurality of p-side well layers and the plurality of n-side well layers has a fourth thickness smaller than the third thickness.

4. The semiconductor light emitting element according to claim 1, wherein the four or more barrier layers are composed of GaN, and the three or more well layers are composed of GaInN, and a concentration of In in the one or plurality of p-side well layers of the well layers is lower than a concentration of In in the plurality of n-side well layers of the well layers.

5. The semiconductor light emitting element according to claim 2, wherein the four or more barrier layers are composed of GaN, and the three or more well layers are composed of GaInN, and a concentration of In in the one or plurality of p-side well layers of the well layers is lower than a concentration of In in the plurality of n-side well layers of the well layers.

6. The semiconductor light emitting element according to claim 3, wherein the four or more barrier layers are composed of GaN, and the three or more well layers are composed of GaInN, and a concentration of In in the one or plurality of p-side well layers of the well layers is lower than a concentration of In in the plurality of n-side well layers of the well layers.

7. A light emitting device, comprising:

a base in which a first wire and a second wire are formed; and a semiconductor light emitting element that is attached to the base, is electrically connected to the first wire and the second wire, and emits light when being supplied with current through the first wire and the second wire, wherein the semiconductor light emitting element includes:

an n-type semiconductor layer that is composed of a group-III nitride semiconductor containing n-type impurities;

a light emitting layer that is stacked on the n-type semiconductor layer, is composed of a group-III nitride semiconductor, and emits light when being supplied with current;

a p-type semiconductor layer that is stacked on the light emitting layer and is composed of a group-III nitride semiconductor containing p-type impurities;

a p-side electrode that electrically connects the p-type semiconductor layer and the first wire; and an n-side electrode that electrically connects the n-type semiconductor layer and the second wire, wherein the light emitting layer includes:

three or more well layers that are composed of a group-III nitride semiconductor; and four or more barrier layers that are composed of a group-III nitride semiconductor having a larger band gap than that of the well layers, and are provided such that each of the three or more well layers is sandwiched from both sides by neighboring two of the barrier layers, and that one of the barrier layers at a boundary with the n-type semiconductor layer is connected to the n-type semiconductor layer while another one of the barrier layers at a boundary with the p-type semiconductor layer is connected to the p-type semiconductor layer, the three or more well layers include:

a plurality of n-side well layers that are provided in order from a side closer to the n-type semiconductor layer, and each of which has a first thickness to emit light of a common wavelength; and one or a plurality of p-side well layers that are provided between a side closer to the p-type semiconductor layer and the n-side well layers, and each of which has a second thickness larger than the first thickness and has a different composition from the plurality of n-side well layers to emit light of the common wavelength.

* * * * *